United States Patent
Huang et al.

(10) Patent No.: US 12,272,608 B2
(45) Date of Patent: Apr. 8, 2025

(54) STATION-TO-STATION CONTROL OF BACKSIDE BOW COMPENSATION DEPOSITION

(71) Applicant: Lam Research Corporation, Fremont, CA (US)

(72) Inventors: Yanhui Huang, Sherwood, OR (US); Vignesh Chandrasekar, King City, OR (US)

(73) Assignee: Lam Research Corporation, Fremont, CA (US)

( * ) Notice: Subject to any disclaimer, the term of this patent is extended or adjusted under 35 U.S.C. 154(b) by 378 days.

(21) Appl. No.: 17/758,071

(22) PCT Filed: Dec. 10, 2020

(86) PCT No.: PCT/US2020/064344
§ 371 (c)(1),
(2) Date: Jun. 27, 2022

(87) PCT Pub. No.: WO2021/138018
PCT Pub. Date: Jul. 8, 2021

(65) Prior Publication Data
US 2023/0032481 A1 Feb. 2, 2023

Related U.S. Application Data

(60) Provisional application No. 62/957,077, filed on Jan. 3, 2020.

(51) Int. Cl.
*H01L 21/66* (2006.01)
*C23C 16/52* (2006.01)
(Continued)

(52) U.S. Cl.
CPC .............. *H01L 22/20* (2013.01); *C23C 16/52* (2013.01); *H01J 37/32449* (2013.01);
(Continued)

(58) Field of Classification Search
None
See application file for complete search history.

(56) References Cited

U.S. PATENT DOCUMENTS 4,256,829 A 3/1981 Daniel
5,009,738 A 4/1991 Gruenwald et al.
(Continued)

FOREIGN PATENT DOCUMENTS

CN 101389415 A 3/2009
CN 101484973 A 7/2009
(Continued)

OTHER PUBLICATIONS

International Preliminary Report on Patentability and written opinion dated Jul. 14, 2022 in Application PCT/US2020/064344.
(Continued)

*Primary Examiner* — Asok K Sarkar
(74) *Attorney, Agent, or Firm* — Weaver Austin Villeneuve & Sampson LLP

(57) ABSTRACT

Methods for reducing warpage of bowed semiconductor substrates, including providing a first substrate to a first station in a semiconductor processing chamber, providing a second substrate to a second station in the semiconductor processing chamber, concurrently depositing a first bow compensation layer of material on the backside of the first substrate at the first station and a first bow compensation layer of material on the backside of the second substrate at the second station, and depositing a second bow compensation layer of material on the backside of the first substrate, while the first substrate is at the first station and the second substrate is at the second station, and while not concurrently depositing material on the backside of the second substrate.

28 Claims, 7 Drawing Sheets

(51) Int. Cl.
  *H01J 37/32* (2006.01)
  *H01L 21/02* (2006.01)
  *C23C 16/34* (2006.01)
  *C23C 16/40* (2006.01)
(52) U.S. Cl.
  CPC .......... *H01J 37/32899* (2013.01); *H01L 21/02164* (2013.01); *H01L 21/0217* (2013.01); *H01L 21/02274* (2013.01); *C23C 16/345* (2013.01); *C23C 16/401* (2013.01); *H01J 2237/24585* (2013.01); *H01J 2237/3321* (2013.01); *H01L 21/02211* (2013.01)

(56) References Cited

U.S. PATENT DOCUMENTS

| | | |
|---|---|---|
| 5,338,363 A | 8/1994 | Kawata et al. |
| 5,384,008 A | 1/1995 | Sinha et al. |
| 6,046,097 A | 4/2000 | Hsieh et al. |
| 6,051,501 A | 4/2000 | Becker et al. |
| 6,153,012 A | 11/2000 | Rupp et al. |
| 6,279,506 B1 | 8/2001 | Jurgensen et al. |
| 6,306,245 B1 | 10/2001 | Yanagisawa et al. |
| 6,838,355 B1 | 1/2005 | Stamper et al. |
| 7,858,898 B2 | 12/2010 | Bailey, III et al. |
| 7,943,007 B2 | 5/2011 | Bailey, III et al. |
| 8,133,322 B2 | 3/2012 | Nakamura et al. |
| 8,562,750 B2 | 10/2013 | Chen et al. |
| 8,785,305 B2 | 7/2014 | Ramdani |
| 9,433,973 B1 | 9/2016 | Ni et al. |
| 9,613,842 B2 | 4/2017 | Garant et al. |
| 9,847,221 B1 | 12/2017 | McLaughlin et al. |
| 9,881,788 B2 | 1/2018 | Kim et al. |
| 10,896,821 B2 | 1/2021 | Liu |
| 10,903,070 B2 | 1/2021 | Liu et al. |
| 2001/0004479 A1 | 6/2001 | Cheung et al. |
| 2002/0179247 A1 | 12/2002 | Davis et al. |
| 2004/0023475 A1 | 2/2004 | Bonser et al. |
| 2004/0023502 A1 | 2/2004 | Tzou et al. |
| 2004/0134611 A1 | 7/2004 | Kato et al. |
| 2004/0137745 A1 | 7/2004 | Houghton et al. |
| 2005/0022740 A1 | 2/2005 | Hatano |
| 2005/0127361 A1 | 6/2005 | Hatano et al. |
| 2006/0223333 A1 | 10/2006 | Li et al. |
| 2007/0015374 A1 | 1/2007 | Granneman |
| 2007/0068900 A1 | 3/2007 | Kim et al. |
| 2007/0224826 A1 | 9/2007 | Delgadino et al. |
| 2008/0150145 A1 | 6/2008 | King et al. |
| 2009/0009675 A1 | 1/2009 | Cho et al. |
| 2009/0241833 A1 | 10/2009 | Moshtagh et al. |
| 2009/0291209 A1 | 11/2009 | Granneman et al. |
| 2010/0261353 A1 | 10/2010 | Prins et al. |
| 2011/0100955 A1 | 5/2011 | Pushparaj et al. |
| 2011/0308551 A1 | 12/2011 | Chung et al. |
| 2012/0090545 A1 | 4/2012 | Chiang et al. |
| 2012/0097641 A1 | 4/2012 | Beckmann et al. |
| 2013/0183834 A1 | 7/2013 | Rogers et al. |
| 2014/0021673 A1 | 1/2014 | Chen et al. |
| 2014/0080324 A1 | 3/2014 | Shrinivasan et al. |
| 2014/0264345 A1 | 9/2014 | Tsai et al. |
| 2015/0294917 A1 | 10/2015 | Devilliers |
| 2015/0332912 A1 | 11/2015 | Nowak et al. |
| 2015/0340225 A1 | 11/2015 | Kim et al. |
| 2016/0020074 A1 | 1/2016 | Mohn et al. |
| 2016/0203995 A1 | 7/2016 | Kanarik et al. |
| 2017/0053808 A1 | 2/2017 | Kamp et al. |
| 2017/0069462 A1 | 3/2017 | Kanarik et al. |
| 2017/0162522 A1 | 6/2017 | Chang et al. |
| 2017/0167024 A1 | 6/2017 | Wiltse et al. |
| 2017/0178891 A1 | 6/2017 | Batinica et al. |
| 2018/0068860 A1 | 3/2018 | Devilliers et al. |
| 2018/0082960 A1 | 3/2018 | Bellotti et al. |
| 2019/0035646 A1* | 1/2019 | Nasman ............ C23C 16/4409 |
| 2019/0062947 A1 | 2/2019 | Savas et al. |
| 2019/0287854 A1 | 9/2019 | Miller et al. |
| 2020/0058486 A1 | 2/2020 | Dai et al. |
| 2021/0079522 A1 | 3/2021 | Wu et al. |
| 2021/0214846 A1 | 7/2021 | Nandwana et al. |
| 2021/0265134 A1 | 8/2021 | Singh et al. |
| 2021/0320036 A1 | 10/2021 | Jain et al. |
| 2021/0366792 A1 | 11/2021 | Fulford et al. |
| 2021/0404064 A1 | 12/2021 | Dip |
| 2022/0013399 A1 | 1/2022 | Rondon et al. |
| 2023/0038611 A1 | 2/2023 | Sircar et al. |
| 2023/0136819 A1 | 5/2023 | Porter et al. |
| 2024/0003010 A1 | 1/2024 | Huang et al. |
| 2025/0037992 A1 | 1/2025 | Hamma et al. |

FOREIGN PATENT DOCUMENTS

| | | |
|---|---|---|
| CN | 102738307 A | 10/2012 |
| CN | 107611012 A | 1/2018 |
| EP | 1050601 A1 | 11/2000 |
| JP | H02220431 A | 9/1990 |
| JP | 2001255670 A | 9/2001 |
| JP | 2002023390 A | 1/2002 |
| JP | 2003037073 A | 2/2003 |
| JP | 2004363444 A | 12/2004 |
| JP | 2007208079 A | 8/2007 |
| JP | 2010062363 A | 3/2010 |
| JP | 2010219106 A | 9/2010 |
| JP | 2016131238 A | 7/2016 |
| JP | 2017503359 A | 1/2017 |
| JP | 2017199909 A | 11/2017 |
| JP | 2018041080 A | 3/2018 |
| JP | 2019504490 A | 2/2019 |
| KR | 19990081521 A | 11/1999 |
| KR | 20080100366 A | 11/2008 |
| KR | 20100004640 A | 1/2010 |
| KR | 100980397 B1 | 9/2010 |
| KR | 20110068374 A | 6/2011 |
| KR | 20140029334 A | 3/2014 |
| KR | 20140086348 A | 7/2014 |
| KR | 20150133644 A | 11/2015 |
| KR | 20150139774 A | 12/2015 |
| KR | 20160085367 A | 7/2016 |
| KR | 20170074755 A | 6/2017 |
| KR | 20180027382 A | 3/2018 |
| KR | 20180095609 A | 8/2018 |
| KR | 20200060579 A | 6/2020 |
| KR | 20200133493 A | 11/2020 |
| KR | 20210073235 A | 6/2021 |
| WO | WO-2019046134 A1 | 3/2019 |
| WO | WO-2019055366 A1 | 3/2019 |
| WO | WO-2020068139 A1 | 4/2020 |
| WO | WO-2021154641 A1 | 8/2021 |
| WO | WO-2021252019 A1 | 12/2021 |
| WO | WO-2022060615 A1 | 3/2022 |

OTHER PUBLICATIONS

International Search Report and Written Opinion dated Apr. 9, 2021 in Application No. PCT/US2020/064344.

International Preliminary Report on Patentability dated Aug. 11, 2022 in PCT Application No. PCT/US2021/014905.

International Preliminary Report on Patentability dated Sep. 15, 2022, in PCT Application No. PCT/US2021/020284.

KR Office Action dated Jul. 12, 2022 in Application No. KR10-2022-7022697.

KR Office Action dated Jul. 15, 2022, in Application No. KR10-2022-7018767 with English translation.

KR Search report dated Jul. 8, 2022, in Application No. 10-2022-7022697.

U.S. Appl. No. 17/759,072, Inventors Sircar et al., filed on Jul. 19, 2022.

CN Office Action dated Apr. 25, 2017 in CN Application No. 201510266980.4.

International Preliminary Report on Patentability and Written Opinion dated Jun. 13, 2024 in PCT Application No. PCT/US2022/080562.

(56) References Cited

OTHER PUBLICATIONS

International Preliminary Report on Patentability and Written Opinion dated Sep. 12, 2024 in PCT Application No. PCT/US2023/012800.
International Preliminary Report on Patentability dated Jun. 15, 2023 in Application No. PCT/US2021/060159.
International Search Report and Written Opinion dated Apr. 12, 2023 in PCT Application No. PCT/US2022/080562.
International Search Report and Written Opinion dated Apr. 26, 2022, in PCT Application No. PCT/US2021/060159.
International Search Report and Written Opinion dated Aug. 30, 2023, in Application No. PCT/US2023/021934.
International Search Report and Written Opinion dated Jan. 2, 2024 in PCT Application No. PCT/US2023/032425.
International Search Report and Written Opinion dated Jun. 10, 2024 in PCT Application No. PCT/US2024/013598.
International Search Report and Written Opinion dated May 30, 2023, in Application No. PCT/US2023/012800.
International Search Report and Written Opinion dated Sep. 20, 2023 in PCT Application No. PCT/US2023/021927.
Invitation to Pay Additional Fees dated Mar. 7, 2022, in Application No. PCT/US2021/060159.
JP Office Action dated Jun. 20, 2023, in application No. JP2022-0169566 with English Translation.
JP Office Action dated Oct. 1, 2024 in JP Application No. 2022-545024 with English translation.
KR First Office Action dated Dec. 29, 2022 in Application No. KR10-2022-7022697 with English translation.
KR Notice of Allowances dated Oct. 7, 2024 in KR Application No. 10-2023-7035349 with English Translation.
KR Office Action dated Apr. 3, 2023, in Application No. KR10-2022-7018767 with English translation.
KR Office Action dated Apr. 28, 2023 in Application No. KR10-2022-7020427 with English Translation.
KR Office Action dated Aug. 26, 2024 in KR Application No. 10-2023-7026031, with English Translation.
KR Office Action dated Dec. 14, 2023 in KR Application No. 10-2023-7026031, with English Translation.
KR Office Action dated Dec. 18, 2023 in KR Application No. 10-2023-7026375, with English Translation.
KR Office Action dated Feb. 8, 2023, in Application No. KR10-2022-7038549 with English translation.
KR Office Action dated Jan. 5, 2024 in KR Application No. 10-2023-7039480 with English translation.
KR Office Action dated Jan. 11, 2024 in KR Application No. 10-2023-7035349, with English Translation.
KR Office Action dated Jul. 1, 2024 in KR Application No. 10-2023-7035349 with English translation.
KR Office Action dated Jul. 17, 2024 in KR Application No. 10-2023-7039480, with English Translation.
KR Office Action dated Jul. 28, 2022, in Application No. KR10-2022-7020427 with English translation.
KR Office Action dated Jun. 27, 2024 in KR Application No. 10-2023-7026375, with English Translation.
KR Office Action dated May 25, 2023, in application No. KR 10-2022-7022697 with English translation.
KR Office Action dated Nov. 25, 2022, in Application No. KR10-2022-7018767 with English translation.
KR Office Action dated Nov. 26, 2022, in Application No. KR10-2022-7020427 with English translation.
KR Prior Art Search dated Jun. 10, 2022, in application No. KR10-2022-7018767 with English translation.
KR Prior Art Search Report dated Nov. 27, 2023, in Application No. 10-2023-7039480 with English translation.
KR Prior Art Search Report dated Oct. 13, 2023, in application No. KR 10-2023-7026375 with English translation.
KR Search report dated Jul. 8, 2022, in Application No. 10-2022-7022697 with English translation.
TW Office Action dated May 31, 2024 in TW Application No. 110103017, with English translation.
U.S. Final Office Action dated Jun. 27, 2017 in U.S. Appl. No. 14/285,544.
U.S. Final Office Action dated Sep. 21, 2016 in U.S. Appl. No. 14/285,544.
U.S. Non-Final Office Action dated Apr. 22, 2016 in U.S. Appl. No. 14/285,544.
U.S. Non-Final Office Action dated Dec. 23, 2016 in U.S. Appl. No. 14/285,544.
U.S. Non-Final Office Action dated Oct. 27, 2015 in U.S. Appl. No. 14/285,544.
U.S. Notice of Allowance dated Sep. 21, 2017 in U.S. Appl. No. 14/285,544.
U.S. Appl. No. 18/255,287, inventors Huang et al., filed on May 31, 2023.
U.S. Appl. No. 18/713,068, inventor Hamma S, filed on May 23, 2024.
U.S. Appl. No. 18/840,480, inventors Lei T, et al., filed on Aug. 21, 2024.
U.S. Restriction requirement dated May 11, 2015 in U.S. Appl. No. 14/285,544.
SG Search Report and Written Opinion dated Jan. 1, 2025 in SG Application No. 11202251457R.
U.S. Corrected Notice of Allowance dated Jan. 21, 2025 in U.S. Appl. No. 17/759,072.
U.S. Notice of Allowance dated Jan. 13, 2025 in U.S. Appl. No. 17/759,072.

* cited by examiner

STATION-TO-STATION CONTROL OF BACKSIDE BOW COMPENSATION DEPOSITION

RELATED APPLICATIONS

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor manufacturing processes involve many deposition and etching operations, which can change wafer bow drastically. For example, in 3D-NAND fabrication, which is gradually replacing 2D-NAND chips due to lower cost and higher reliability in various applications, multi-stacked films with thick, high stress carbon-based hard masks can cause significant wafer warpage, leading to front side lithographic overlay mismatch, or even wafer bow beyond chucking limit of an electrostatic chuck.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Figure 1:
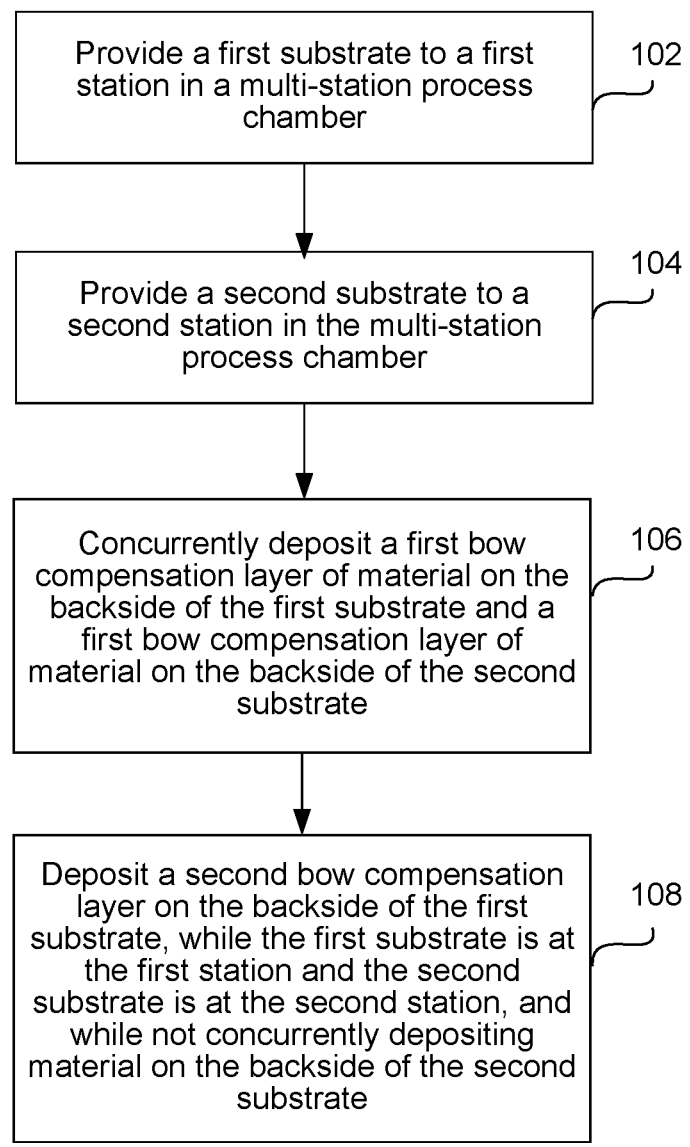
FIG. 1 is a process flow diagram showing operations performed in a method in accordance with certain disclosed embodiments.

In one embodiment, a method may be provided. The method may include providing a first substrate to a first station in a semiconductor processing chamber, providing a second substrate to a second station in the semiconductor processing chamber, concurrently depositing a first bow compensation layer of material on the backside of the first substrate at the first station and a first bow compensation layer of material on the backside of the second substrate at the second station, and depositing a second bow compensation layer of material on the backside of the first substrate, while the first substrate is at the first station and the second substrate is at the second station, and while not concurrently depositing material on the backside of the second substrate.

In some embodiments, the concurrently depositing the first bow compensation layer of material on the backside of the first substrate and on the backside of the second substrate may further include concurrently flowing a precursor onto the backside of the first substrate at the first station and onto the backside of the second substrate at the second station, and the depositing the second bow compensation layer of material on the backside of the first substrate may further include flowing the precursor onto the backside of the first substrate at the first station while not concurrently flowing the precursor onto the backside of the second substrate.

In some embodiments, the depositing the first bow compensation layer of material and the second bow compensation layer of material on the backside of the first substrate may reduce a first bow of the first substrate by a first amount, and the depositing the first bow compensation layer of material on the backside of the second substrate may reduce a second bow of the second substrate by a second amount less than the first amount.

In some embodiments, the first substrate may be bowed with a first bow when provided to the first station, and the second substrate may be bowed with a second bow that is less than the first bow when provided to the second station.

In some such embodiments, the first bow may be between −30 μm and +30 μm, the second bow may be between −30 μm and +30 μm and less than the first bow, after the depositing the first bow compensation layer of material and the second bow compensation layer of material on the backside of the first substrate, the first substrate may have a third bow that is between −10 μm and +10 μm, and after the depositing the first bow compensation layer of material onto the backside of the second substrate, the second substrate may have a fourth bow that is between −10 μm and +10 μm.

In some such embodiments, the first bow may be between −300 μm and +300 μm, the second bow may be between −300 μm and +300 μm and less than the first bow, after the depositing the first bow compensation layer of material and the second bow compensation layer of material on the backside of the first substrate, the first substrate may have a third bow that is between −200 μm and +200 μm, and after the depositing the first bow compensation layer of material onto the backside of the second substrate, the second substrate may have a fourth bow that is between −200 μm and +200 μm.

In some embodiments, the concurrently depositing the first bow compensation layer on the backside of the first substrate and on the backside of the second substrate may be performed before the depositing the second bow compensation layer on the backside of the first substrate while not concurrently depositing material on the backside of the second substrate.

In some such embodiments, the method may further include stopping, after the concurrently depositing the first bow compensation layer on the backside of the first substrate and on the backside of the second substrate, the depositing of the first bow compensation layer on the second substrate. Material may be continuously deposited on the backside of the first substrate during and between the concurrently depositing and the depositing the second layer of material on the backside of the first substrate.

In some such embodiments, the concurrently depositing the first bow compensation layer of material on the backside of the first substrate and on the backside of the second substrate may further include concurrently flowing a precursor onto the backside of the first substrate at the first station and onto the backside of the second substrate at the second station, the depositing the second bow compensation layer of material on the backside of the first substrate may further include flowing the precursor onto the backside of the first substrate at the first station while not concurrently flowing the precursor onto the backside of the second substrate, the stopping may further include stopping the flow of the precursor onto the backside of the second substrate, and the precursor may be continuously flowed onto the backside of the first substrate during and between the concurrently depositing and the depositing the second layer of material on the backside of the first substrate.

In some embodiments, the depositing the second bow compensation layer on the backside of the first substrate while not concurrently depositing material on the backside of the second substrate may be performed before the concurrently depositing the first bow compensation layer on the backside of the first substrate and on the backside of the second substrate.

In some such embodiments, the method may further include starting, after the depositing of the first bow compensation layer on the second substrate while not concurrently depositing material on the backside of the second substrate, the concurrently depositing the first bow compensation layer on the backside of the first substrate and on the backside of the second substrate, and material may be continuously deposited on the backside of the first substrate during and between the concurrently depositing and the depositing the second layer of material on the backside of the first substrate.

In some such embodiments, the concurrently depositing the first bow compensation layer of material on the backside of the first substrate and on the backside of the second substrate may further include concurrently flowing a precursor onto the backside of the first substrate at the first station and onto the backside of the second substrate at the second station, the depositing the second bow compensation layer of material on the backside of the first substrate may further include flowing the precursor onto the backside of the first substrate at the first station while not concurrently flowing the precursor onto the backside of the second substrate, the starting may further include starting the flow of the precursor onto the backside of the second substrate, and the precursor may be continuously flowed onto the backside of the first substrate during and between the concurrently depositing and the depositing the second layer of material on the backside of the first substrate.

In some embodiments, the first bow compensation layer of material and the second bow compensation layer of material may include silicon nitride.

In some such embodiments, the first substrate may be bowed with a first concave bow when provided to the first station, and the second substrate may be bowed with a second concave bow when provided to the second station.

In some such embodiments, the depositing the first bow compensation layer of material on the backside of the first substrate and on the backside of the second substrate may further include contacting the backside of the substrates with ammonia and a silicon-containing precursor, and the depositing the second bow compensation layer of material on the backside of the first substrate may further include contacting the backside of the substrates with ammonia and a silicon-containing precursor.

In some embodiments, the first bow compensation layer of material and the second bow compensation layer of material may include silicon oxide.

In some such embodiments, the first substrate may be bowed with a first convex bow when provided to the first station, and the second substrate may be bowed with a second convex bow when provided to the second station.

In some such embodiments, the depositing the first bow compensation layer of material on the backside of the first substrate and on the backside of the second substrate may further include contacting the backside of the substrates with nitrous oxide and a silicon-containing precursor, and the depositing the second bow compensation layer of material on the backside of the first substrate may further include contacting the backside of the substrates with nitrous oxide and a silicon-containing precursor In some embodiments, when provided to the first station, the first substrate may be bowed and has layers deposited on the front side of the first substrate that have internal compressive stress, when provided to the second station, the second substrate may be bowed and has layers deposited on the front side of the second substrate that have internal compressive stress, and the first bow compensation layer of material deposited on the backside of the first substrate and on the backside of the second substrate may have internal tensile stress.

In some embodiments, when provided to the first station, the first substrate may be bowed and has layers deposited on the front side of the first substrate that have internal tensile stress, when provided to the second station, the second substrate may be bowed and has layers deposited on the front side of the second substrate that have internal tensile stress, and the first bow compensation layer of material deposited on the backside of the first substrate and on the backside of the second substrate may have internal compressive stress.

In some embodiments, the depositing the bow compensation layers of material onto the first substrate and the second substrate may be performed by plasma enhanced chemical vapor deposition.

In some such embodiments, the depositing the bow compensation layers of material onto the first substrate and the second substrate may include igniting a plasma at the first station, and the plasma at the first station may not be not extinguished during and between the concurrently depositing and the depositing the second layer of material on the backside of the first substrate.

In some embodiments, the method may further include determining, before the providing the first substrate to the first station, a measured first bow of the first substrate, determining, before the providing the second substrate to the second station, a measured second bow of the second substrate, determining, based on the measured first bow, a first deposition time for depositing the bow compensation material onto the first substrate, and determining, based on the measured second bow, a second deposition time for depositing the bow compensation material onto the second substrate. The first deposition time may be greater than the second deposition time, the concurrently depositing the first bow compensation layer of material on the backside of the first substrate and on the backside of the second substrate may be performed for the second deposition time, the depositing the second bow compensation layer of material on the backside of the first substrate may be performed for a third deposition time, and the first deposition time may substantially equals the second deposition time plus the third deposition time.

In some such embodiments, the determining the measured first bow and the measured second bow may be determined using one or more lasers.

In some such embodiments, the determining the first deposition time may further include applying the measured first bow, or a parameter derived therefrom, to a relationship between (i) a backside deposition time required to reduce a bow on a substrate, and (ii) a variable representing a bow reduction amount, and the applying returns the first deposition time.

In some further such embodiments, the relationship may be substantially linear.

In some embodiments, the depositing the first bow compensation layer of material and the depositing the second bow compensation layer of material on the backside of the first substrate may be performed for a time range between 60 seconds and 2,000 seconds, and the depositing the first bow compensation layer of material on the backside of the second substrate may be performed for a time range between 60 seconds and 2,000 seconds.

In some embodiments, the depositing the first bow compensation layer of material and the second bow compensation layer of material on the backside of the first substrate may result in a first total thickness of material on the backside of the first substrate, and the depositing the first bow compensation layer of material on the backside of the second substrate may result in a second total thickness of material on the backside of the second substrate that is smaller than the first total thickness.

In one embodiment, a method may be provided. The method may include providing a first substrate to a first station in a semiconductor processing chamber, providing a second substrate to a second station in the semiconductor processing chamber, concurrently depositing a first bow compensation layer of material having a property with a first value on the backside of the first substrate at the first station under a first set of process conditions, and a second bow compensation layer of material having the property with a second value on the backside of the second substrate at the second station under a second set of process conditions different than the first set of process conditions. The first value of the property of the first bow compensation layer of material is different than the second value of the property of the second bow compensation layer of material.

In some embodiments, the property may be thickness, and the first value may be greater than the second value.

In some embodiments, the property may be compressive stress.

In some embodiments, the property may be tensile stress.

In some embodiments, the first set of process conditions may have a first duration and the second set of process conditions may have a second duration less than the first duration.

In some embodiments, the first set of process conditions may have a first temperature and the second set of process conditions may have a second temperature different than the first temperature.

In some embodiments, the first set of process conditions may have a first precursor flowrate and the second set of process conditions may have a second precursor flowrate different than the first precursor flowrate.

In some embodiments, the first set of process conditions may have a first plasma power and the second set of process conditions may have a second plasma power different than the first plasma power.

In one embodiment, a method may be provided. The method may include providing a first substrate to a first station in a semiconductor processing chamber, providing a second substrate to a second station in the semiconductor processing chamber, concurrently depositing a first bow compensation layer of material on the backside of the first substrate at the first station under a first set of process conditions and a first bow compensation layer of material on the backside of the second substrate at the second station under the first set of process conditions, adjusting the process conditions at the second station to a second set of process conditions that is different than the first set of process conditions, and concurrently depositing a second bow compensation layer of material on the backside of the first substrate at the first station under the first set of process conditions, and a third bow compensation layer of material on the backside of the second substrate at the second station under the second set of process conditions. The second bow compensation layer of material is different than the third bow compensation layer of material.

In some embodiments, the adjusting may further include changing the plasma power at the second station.

In some embodiments, the adjusting may further include changing the temperature at the second station.

In some embodiments, the adjusting may further include changing the precursor flowrate at the second station.

In one embodiment, a system for performing backside deposition onto substrates may be provided. The system may include a gas delivery system including a precursor gas source, a processing chamber that includes at least two stations, and each station is fluidically connected to the gas delivery system and configured to flow a precursor onto the backside of a substrate at that station, and a controller for controlling the system and including control logic for causing the gas delivery system to concurrently flow the precursor onto the backside of the first substrate at the first station and onto the backside of the second substrate at the second station, and thereby concurrently deposit a first bow compensation layer of material on the backside of the first substrate and a first bow compensation layer of material on the backside of the second substrate, and causing the gas delivery system to flow the precursor onto the backside of the first substrate at the first station, and thereby deposit a second bow compensation layer of material on the backside of the first substrate, while causing the gas delivery system to not concurrently flow the precursor onto the backside of the second substrate at the second station and not deposit a material on the backside of the second substrate.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "wafer" and "substrate" are used interchangeably. One of ordinary skill in the art would understand in many embodiments the methods and apparatus described herein can be used prior to or during processing of a silicon wafer during any of many stages of integrated circuit fabrication thereon. A wafer or substrate used in the semiconductor device industry typically has a diameter of 200 mm, 300 mm, or 450 mm. Other types of reactors that may benefit from the disclosed embodiments include those used to fabricate various articles such as printed circuit boards, displays, and the like. In addition to semiconductor wafers, the methods and apparatus described herein may be used with deposition chambers configured for other types of substrates including glass and plastic panels. Accordingly, where the term "wafer" is used in the description below, it will be understood that the description also applies to a panel or other substrate.

INTRODUCTION AND CONTEXT

Semiconductor fabrication processes involve formation of various structures, many of which may be two-dimensional. As semiconductor device dimensions shrink and devices are scaled to be smaller, the density of features across a semiconductor substrate increases, resulting in a layers of material etched and deposited in various ways, including in three dimensions. For example, 3D-NAND is one technology that is becoming increasingly popular due to lower cost and increased memory density compared to other techniques, such as 2D-NAND, and higher reliability in various applications. During the fabrication of a 3D-NAND structure, wafer bow can change drastically. For example, deposition of thick hard mask materials and etching of trenches along a wafer surface in fabricating a 3D-NAND structure can cause wafer bowing.

As layers of films are stacked on top of each other during fabrication, more stress is introduced to the semiconductor wafer which can cause bowing. The bowing can have various shapes. In a concave-shaped wafer, sometimes referred to as a "smiling wafer" or a bow-shaped wafer, the lowest point is the center of the wafer and the highest point is the edge of the wafer. In a convex-shaped wafer, sometimes referred to as a "sad wafer" or dome-shaped wafer, the lowest point is the edge of the wafer and the highest point is the center of the wafer. These concave-shaped and convex-shaped wafers may have symmetrical, or substantially symmetrical (e.g., within ±15% of symmetric) bowing.

Bowing can be measured using an optical technique. Wafer bowing can be measured or evaluated by obtaining a wafer map. Bowing can be quantified using a bow value or warpage value as described herein, which is measured as the vertical distance between the lowest point of the semiconductor wafer to the highest point on the wafer. The warpage value can be along an axis, such as a vertical z-axis. For example, high bowing can be caused by deposition of a thick, high stress carbon hard mask layer and additional bowing can be caused by subsequent processing this mask layer is deposited, such as etching and additional deposition processes. In some instances, this processing may case wafer warpage of up to a variation of between ±1000 to −1300 μm bow, including −1000 μm.

Bowing can cause numerous problems with subsequent processing if the substrate is warped. For example, during lithography, etching can be uneven if the substrate is warped. Similarly, subsequently deposited layers may be uneven and may increase the substrate bowing which can cause nonuniformity and defects on the wafer. This warpage can be a particular challenge, especially when wafers are used in subsequent processing involve chucking of the wafer to an electrostatic chuck, as many electrostatic chucks have a "chucking limit," which is defined as the maximum warpage tolerated before the wafer cannot be effectively chucked. Many electrostatic chucks have a chucking limit of about ±300 μm. As a result, highly warped semiconductor substrates may not be processed in some tools. In multi-station semiconductor processing, in which two or more wafers are concurrently processed at different stations in the same processing chamber, wafers with bowing can cause station-to-station nonuniformity.

It is therefore desirable to reduce wafer bowing which may be done by depositing one or more layers of material onto the backside of the wafer to compensate for the bowing caused by the processing to the front side of the wafer. These layers deposited onto the backside of wafers may be considered bow compensation layers. In general, characteristics of the bow compensation layer, including its thickness and composition, for example, affects the amount of bow that can be compensated by that layer. For example, in some instances the thicker the bow compensation layer becomes, the more bow compensation may cause. In one instance, a bow compensation layer having a thickness of 4,400 Angstroms (Å) may cause a bow compensation of approximately 200 μm, while a bow compensation layer having a thickness of 3,200 Å may cause a bow compensation of approximately 150 μm. The relationship between bow compensation layer thickness and the bow compensation amount may be considered a monotonic relationship in which the value of one variable increases as the value of the other variable also increase, and similarly, the value of one decreases as the value of the other also decreases.

It is further desirable to reduce wafer bowing of multiple wafers at the same time, i.e., concurrently. Various efficiencies may be achieved using a multi-station processing apparatus like that described below, such as reduced equipment cost and operational expenses, as well as increased throughput. For instance, a single vacuum pump may be used to create a single high-vacuum environment for all four process stations by evacuating spent process gases, etc. for all four process stations. Many typical multi-station processing techniques concurrently deposit the same thickness bow compensation layer on each wafer in the chamber such the bow on each wafer is reduced by the same, or substantially the same (e.g., within about ±5%), amount.

The present inventors discovered that some multi-station frontside substrate processing causes different amounts of bowing to substrates that are processed in the same chamber at the same time. For instance, many multi-station processing techniques and apparatuses are designed to create the same processing conditions at each station and thus produce the same processing result, e.g., deposited layers having the same uniformity and thickness, but unintended process condition variations within some stations, and between stations, may lead to uneven material and features on the wafers which in turn may result in the substrates having different warpage amounts than each other. Similarly, chamber-to-chamber variations in the same process flow can cause unintended non-uniform warpage. For instance, some tools may follow particular operating conditions and specifications, but the chambers may not be calibrated the exact same that thus lead to uneven material and features on the wafer which may cause different warpage amounts of material.

The present inventors further discovered that the typical multi-station processing techniques and apparatuses for depositing backside bow compensation layers generally cannot deposit backside bow compensation layers with different thicknesses on different substrates positioned in the same chamber at the same time. For instance, in a typical chamber having 2 stations and a bowed substrate at each station, these typical techniques and apparatuses generally cannot deposit a bow compensation layer with a first thickness at the first station and a bow compensation layer with a different thickness at the second station. These typical techniques and apparatuses are generally limited to depositing bow compensation layers with the same thickness on the two substrates that are in the same chamber at the same time. Many typical techniques and apparatuses are limited because they lack station-to-station control of process conditions, such as powering off the plasma at only one station while concurrently continuing to generate the plasma at another station. Even if these typical multi-station processing apparatuses and techniques have some adjustability, the present inventors found that adjusting numerous process conditions, such as the gap between the substrate and the electrode during plasma generation, adversely affects the substrate by changing processing conditions too much and leading to undesirable processing conditions.

However, the present inventors discovered that by adjusting some particular process conditions, such as controlling the precursor flow to each station in the multi-station chamber, bow compensation layers with different thicknesses and/or different internal stresses could be deposited on different substrates while the substrates are in the chamber at the same time. Described herein are techniques and apparatuses for depositing bow compensation layers having different thicknesses and/or different internal stresses onto the backside of bowed wafers with different bow amounts that are in the same chamber at the same time. These techniques and apparatuses use station-to-station control to deposit the different thickness bow compensation layers and the different internal stress layers, including in some embodiments, station-to-station control of precursor flow to start and stop the deposition at each station. These new techniques and apparatuses are able to compensate for and reduce different wafer bow amounts, caused by the frontside processing, on wafers that are in the same chamber at the same time.

Example Processing Techniques

Described herein are techniques and apparatuses for depositing bow compensation layers of material with different thicknesses and/or different internal stresses on the backside of wafers that are in the same multi-station chamber at the same time. This deposition may be performed using, for example, plasma enhanced chemical vapor deposition (PECVD). These techniques and apparatuses load two or more substrates with different bows into the multi-station chamber and adjust the backside deposition conditions in order to deposit one bow compensation layer having one thickness on the backside of one substrate and another bow compensation layer having a different thickness on the backside of another substrate. These techniques may also additionally or alternatively adjust the backside deposition conditions in order to deposit one bow compensation layer having internal stresses on the backside of one substrate and another bow compensation layer having different internal stresses on the backside of another substrate. The thickness of the bow compensating layer may be controlled (station-to-station) by any one or more of various techniques, including the local duration of the deposition process and the local reaction conditions (e.g., temperature, flow rate, plasma power, etc. at individual stations). The internal stress of the bow compensating layer may be similarly adjusted (station-to-station) by controlling local conditions. Unless otherwise stated herein, the term "deposition" relates to deposition of material on the backside, not the frontside, of a substrate.

For example, a first substrate having a bow of +50 μm may be provided to a first station of the multi-station processing chamber and a second substrate having a bow of +20 μm may be provided to a second station in the same chamber. Subsequent processing may require that the bows of these two substrates be within ±10 μm. Accordingly, the first substrate requires more bow compensation, and thus a thicker bow compensation layer, than the second substrate in order to be within the required processing bow range of ±10 μm. In some of the embodiments described herein, while both substrates are in the same chamber at the same time, a bow compensation layer with a first thickness may be deposited onto the backside of first substrate to reduce its bow from +50 to within ±10 μm, and a bow compensation layer with a second thickness less than the first thickness may be deposited onto the backside of the second substrate to reduce its bow from +20 μm to within ±10 μm. In some embodiments, this may be accomplished by flowing the precursor, during plasma generation for PECVD, onto the backside of the first substrate for a longer time than onto the backside of the second substrate in order to deposit a thicker bow compensation layer on the first substrate than on the second substrate.

Backside deposition may be performed by inserting the semiconductor wafer into a process chamber having both a top showerhead and a bottom showerhead (the bottom showerhead of which may be referred to as a showerhead to the pedestal, or a "shoped"), with wafer holders to hold the wafer between the two showerheads. Processing may be performed by positioning the wafer close to the top showerhead and delivering process gases to the backside of the wafer via the bottom showerhead. In some embodiments, the wafer may be placed upside down to use the top showerhead to deliver gases to the backside of the wafer, but in many embodiments, the wafer is placed upright with the patterned regions facing up and process gases are delivered to the backside of the wafer from a bottom showerhead. In various embodiments, the backside of the wafer is flat and is not patterned.

In various embodiments, a showerhead includes multiple holes or nozzles for flowing process gases to the backside of the semiconductor wafer. In some embodiments, a showerhead includes thousands of small holes for flowing process gases. Holes may have a diameter between about 0.5 mm and about 1 mm. Process gases are flowed to all of the holes evenly such that all gases flowed to the showerhead to be delivered to the substrates are delivered via every hole in the showerhead. In some embodiments, holes in the showerhead all deliver the same gas at the same time.

FIG. 1 is a process flow diagram showing operations performed in a method in accordance with certain disclosed embodiments. In operation 102, a first semiconductor substrate is provided to a first station in a multi-station process chamber, and in operation 104 a second semiconductor substrate is provided to a second station in the multi-station process chamber. The first and second substrates may each be a silicon wafer, e.g., a 200-mm wafer, a 300-mm wafer, or a 450-mm wafer, including wafers having one or more layers of material, such as dielectric, conducting, or semiconducting material deposited thereon. Some of the one or more layers may be patterned. Non-limiting examples of layers include dielectric layers and conducting layers, e.g., silicon oxides, silicon nitrides, silicon carbides, metal oxides, metal nitrides, metal carbides, and metal layers. In various embodiments, the substrate is patterned.

In some embodiments, when provided into the processing chamber, the first substrate is bowed with a first bow and the second substrate is bowed with a second bow that is different and less than the first bow. These bow amounts, while different from each other, may be within ±1000 μm, ±500 μm, ±300 μm, ±100 μm, ±50 μm, and ±30 μm. In order to compensate for and reduce the different bow amounts on the first and second substrates that are in the same chamber at the same time, different thickness bow compensation layers are deposited onto the backside of each substrate. Because the first bow of the first substrate is greater than the second bow of the second substrate, more bow compensation material is deposited onto the backside of the first substrate.

In operation 106, a first bow compensation layer is concurrently deposited onto the backside of both the first substrate and the second substrate such that this layer of material is deposited on each substrate at the same time. This concurrent deposition may include flowing various process gases, including one or more precursors, onto the backside of the first and second substrates at the same time and, in some embodiments, also generating a plasma at the first and second stations at the same time. A gas delivery system is used to flow the process gases to each station and this system may include precursor gas sources(s), carrier gas source(s), fluid conduits through which the gas flows, valves to control gas flow, and gas propellant features such as a mass flow controller (MFC) which causes gas to move.

As stated, the thickness of the bow compensating layer may be controlled (station-to-station) by any one or more of various techniques, including the local duration of the deposition process and the local reaction conditions (e.g., temp, flow rate, plasma power, etc. at individual stations). In some embodiments, in order to deposit a thicker bow compensation layer on the first substrate than on the backside of the second substrate, more deposition of the bow compensation material is performed on the backside of the first substrate, e.g., the duration of the backside deposition on the first substrate is longer than on the second substrate. In operation 108, while both the first and second substrates are in the chamber at their respective stations, deposition of the bow compensation material is performed on the backside of the first substrate while at the same time, no deposition is performed on the backside of the second substrate. Therefore, during this operation 108, deposition is only on the backside of the first substrate; no deposition is performed on the backside of the second substrate while it remains at the second station. By depositing this additional bow compensation material onto the first substrate, and not the second substrate, after operations 106 and 108, the backside of first substrate has an overall thicker bow compensation layer than the second substrate. For instance, the first bow compensation layer may have a first thickness T1 and the second bow compensation layer may have a second thickness T2. After operation 106, the first and second substrates both have a bow compensation layer of material with thickness T1, and after both operations 106 and 108, the first substrate has a total, overall bow compensation layer of material with thickness T1+T2, while the second substrate a total, overall bow compensation layer of material with thickness T1 which is less than T1+T2. By depositing more bow compensation material onto the backside of the first substrate, its bow is reduced or compensated more than the bow of the second substrate.

As stated above, in addition or alternatively to producing bow compensation layers with different thicknesses, in some embodiments the techniques described herein may use station-to-station control of various process conditions to produce bow compensation layers with different internal stresses than each other. This station-to-station control may include controlling the local process conditions at each station, e.g., temperature, flowrate, plasma power, etc., at each station to produce bow compensation layers with different internal stresses than each other. For example, depositing the first and second bow compensation layers on the first substrate may cause the total bow compensation layers on the first substrate to have internal stresses, e.g., more or less tensile or compressive stress, than the first compensation layer deposited on the second substrate.

Operations 106 and 108 may be performed in various orders and manners. In some embodiments, as shown in FIG. 1, operation 106 may be performed before 108 such that the first bow compensation layer of material is concurrently deposited onto the first and second substrates before the second layer of material is deposited onto only the first substrate. Operation 106 may end in various manners. In some embodiments, the deposition onto the backside of the second substrate at the second station may be stopped which may therefore end operation 106. In some such embodiments, the deposition at the first station may be continuous such that the first bow compensation layer and the second bow compensation layer are deposited onto the backside of the first substrate in one continuous deposition process and once the first bow compensation layer has been deposited on both the first and second substrates, the deposition on the second substrate may be stopped while the deposition at the first station continues, thereby ending operation 106 while simultaneously starting operation 108. In some instances when the deposition of the first and second bow compensation layers is continuous on the back side of the first substrate, these layers may not be physically separate layers, but rather first and second portions of one continuous layer of material.

In some other embodiments, deposition on the backside of the first substrate and the second substrate may stop, therefore ending operation 106, and afterwards, deposition at only the first station may start, thus starting operation 108. In some such instances, the first and second bow compensation layers may be separately deposited layers of material, with the second bow compensation layer deposited on top of the first bow compensation layer.

The techniques described herein use station-to-station control to deposit the different thickness bow compensation layers, including station-to-station control of precursor flow to start and stop the deposition at each station. For example, in some embodiments, the control of the precursor to and at each station may control the start and stop of the deposition at that station. The deposition of a bow compensation layer at the first and second stations may start by flowing the precursor to each station such that the precursor flows onto and contacts the backside of the first substrate at the first station and the backside of the second substrate at the second station. Accordingly, the deposition of the first bow compensation layers at the first and second stations may begin by starting the flow of the precursor to each station so that the precursor flows onto and contacts the backside of the first substrate at the first station and the backside of the second substrate at the second station.

In some embodiments, the "start" of this deposition may be considered when the precursor comes into contact with the substrate even though the flow of the precursor to the station may have been started within the gas delivery system before this "start." In some other embodiments, the "start" of this deposition may be considered when the gas delivery system causes the precursor to begin flowing to the station. In general, the gas delivery system causes gas to flow to a station by opening valves to direct the gas through the proper fluid conduits to reach the station and causing a flow control element, such as an MFC, to move the gas. This generally causes a time delay from when the gas is caused to move to when it reaches the chamber and station.

The deposition of the second bow compensation layer at the first station may also begin by flowing of the precursor to the first station each station so that the precursor flows onto and contacts the backside of the first substrate at the first station and the backside of the second substrate at the second station. In the embodiments in which the deposition on the first substrate is continuous, the "start" of operation 108 may be the continuation of the precursor flow onto the backside of the first substrate.

Similarly, the deposition of a bow compensation layer may stop by stopping the flow of precursor onto the backside of a substrate. In some embodiments, the "stop" of the deposition may be considered when the precursor no longer contacts the substrate even though the flow of the precursor to the station may have been stopped within the gas delivery system before this "stop." In some other embodiments, the "stop" of this deposition may be considered when the gas delivery system causes the gas to stop flowing to the station. There may be a delay from when the gas delivery may stop the flow to the station, e.g., by closing a valve or stopping the MFC from flowing gas, to when the gas is no longer contacting the substrate because the residual gas in the fluid conduits between the valve, MFC, or other flow control element and the station. Accordingly, in some embodiments, operation 106 may end when the gas delivery system stops flow of the precursor to the second station, or when the precursor is no longer contacting the backside of the second substrate.

Figure 2:
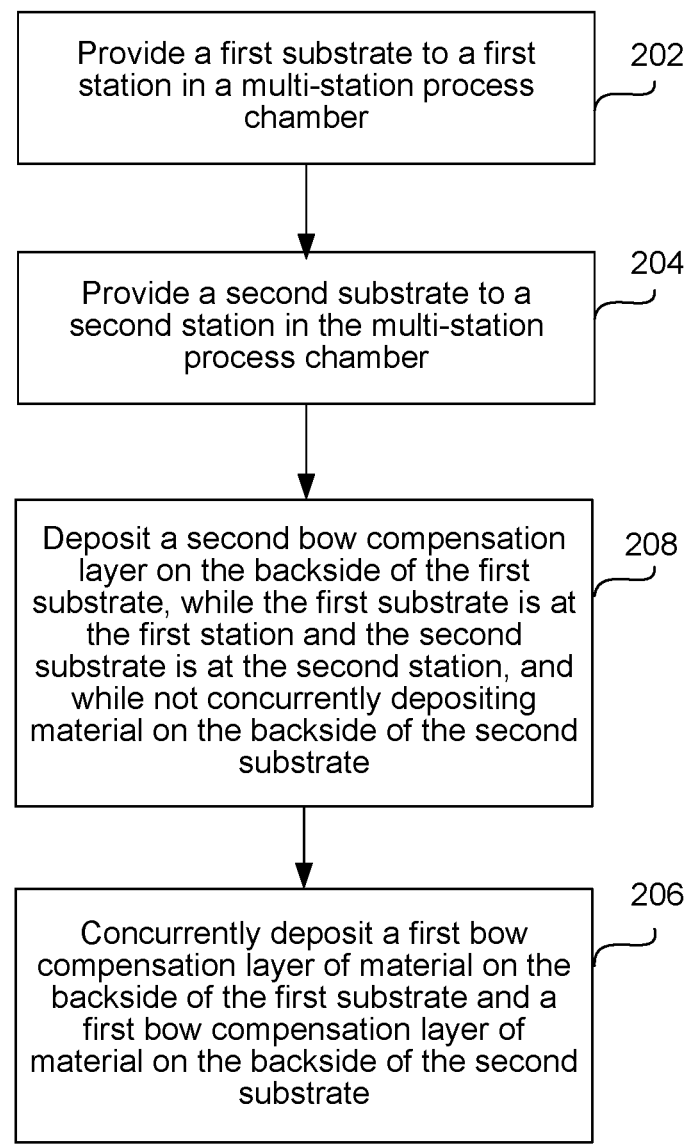
FIG. 2 depicts a process flow diagram showing operations performed in a method in accordance with certain disclosed embodiments.

In some embodiments, operation 108 may be performed before operation 106 such that deposition onto the backside of only the first substrate, while no deposition occurs on the backside of the second substrate, is performed before the concurrent deposition on the backside of the first and second substrates. This sequence is shown in FIG. 2 which depicts a process flow diagram showing operations performed in a method in accordance with certain disclosed embodiments. In this Figures, operations 202, 204, 206, and 208 are the same as operations 102, 104, 106, and 108 of FIG. 1, except that operation 108, now 208, is performed before operation 106, now 206. In some embodiments, operation 208 may be performed by flowing precursor only to the first station and onto the backside of the first substrate, while at the same time precursor is not flowed to the second station or onto the backside of the second substrate. This may first deposit the second bow compensation layer onto the backside of the first substrate while at the same time, no material is deposited onto the backside of the second substrate.

Similar to above, in some embodiments, the deposition onto the backside of the first substrate in operation 208 and then operation 206 may be a continuous deposition process such that the deposition onto the backside of the first substrate is not stopped until after operation 208 and then operation 206 have been performed. In these embodiments, the deposition onto the backside of the second substrate begins while the deposition on the backside of the first substrate continues. The concurrent deposition of operation 206 may begin by continuing to flow the precursor onto the first substrate and by starting to flow the precursor onto the backside of the first substrate. Again, the operation 206 may be considered to have started when the precursor is caused to flow to the second station or when the precursor begins contacting the backside of the second substrate.

Although the techniques of FIGS. 1 and 2 use two stations and two substrates, the present techniques are applicable to multi-station chambers having more than two stations, such as three, four, or six stations, for instance. In these multi-station chambers, the backside bow compensation layer on at least two substrates at the stations may be different. For example, in a four station chamber having one substrate at each station, concurrent backside bow compensation layer deposition may occur on all four substrates for a period of time and in the remaining processing time, the backside bow compensation layer depositions may be performed for shorter or longer durations than the other substrates. In some embodiments, three substrates may receive the same backside bow compensation layer deposition while the fourth substrate receives additional backside bow compensation layer deposition while no deposition occurs on the other three substrates. In some embodiments, a first substrate and a substrate may receive the same backside bow compensation layer deposition, a third substrate may receive more bow compensation layer deposition than the first and second substrates, but less than the fourth substrate, and the fourth substrate may receive more bow compensation layer deposition than the first, second, and third substrates. Here, concurrent bow compensation layer deposition may occur on all four substrates for a period of time, concurrent bow compensation layer deposition may occur on the third and fourth substrates while no deposition occurs on the first and second substrates, and bow compensation layer deposition may occur on only the fourth substrate while no deposition occurs on the other three substrates.

In some embodiments, all four substrates may receive different amounts of backside bow compensation layer deposition. For example, in some embodiments, there is some concurrent backside bow compensation layer deposition on all four substrates, but the second substrate receives more backside bow compensation layer deposition than the first substrate, but less than the second, third, and fourth substrates. The third substrate receives more backside bow compensation layer deposition than the first and second substrates, but less than the fourth substrate, and the fourth substrate receives more backside bow compensation layer deposition than the first, second, and third substrates. In some such embodiments, concurrent backside bow compensation layer deposition may occur on all four substrates for a period of time, concurrent backside bow compensation layer deposition may occur on the second, third, and fourth substrates while no backside deposition occurs on the first substrate, concurrent backside bow compensation layer deposition may occur on the third and fourth substrates while no backside deposition occurs on the first and second substrates, and backside bow compensation layer deposition may occur on only the fourth substrate while no backside deposition occurs on the other three substrates.

The sequence of these depositions may vary similar to above. For instance, the concurrent backside bow compensation layer deposition of all four substrates may occur first, followed by concurrent backside bow compensation layer deposition on only the second, third, and fourth substrates, followed by concurrent backside bow compensation layer deposition on only the third and fourth substrate, followed by backside bow compensation layer deposition on only the fourth. In some other instances, the sequence may be reversed such that backside bow compensation layer deposition on only the fourth substrate occurs first, followed by concurrent backside bow compensation layer deposition of the third and fourth substrates, followed by concurrent backside bow compensation layer deposition of the second, third, and fourth substrates, followed by concurrent backside bow compensation layer deposition of all four substrates.

For example, in some embodiments the technique of FIG. 1 may have a third station and may include additional operations, such as providing a third substrate to a third station in the chamber, concurrently flowing the precursor onto the backside of the first substrate at the first station, onto the backside of the second substrate at the second station, and onto the backside of the third substrate at the third station, thereby depositing a third bow compensation layer of material on the backside of the first substrate, a third bow compensation layer of material on the backside of the second substrate, and a third bow compensation layer of material on the backside of the third substrate. The concurrently flowing the precursor onto the backside of the first substrate at the first station and onto the backside of the second substrate at the second station of operation 106 may further include not concurrently flowing the precursor onto the backside of the third and not depositing a material on the backside of the third substrate. The flowing the precursor onto the backside of the first substrate at the first station while not concurrently flowing the precursor onto the backside of the second substrate at the second station and not depositing a material on the backside of the second substrate of operation 108 may further include not concurrently flowing the precursor onto the backside of the third substrate at the third station and not depositing a material on the backside of the third substrate.

As stated herein, the thickness of the bow compensating layer may be controlled (station-to-station) by any one or more of various techniques, including the local duration of the deposition process and the local reaction conditions (e.g., temp, flow rate, plasma power, etc. at individual stations). Accordingly, in some embodiments a technique may include concurrently depositing a first bow compensation layer onto the backside of a first substrate under a first set of deposition conditions and depositing a second bow compensation layer onto the backside of a second substrate under a second set of deposition conditions in which these different deposition conditions result in the first and second bow compensation layers having different properties, such as different thicknesses or different internal stresses (e.g., more or less tensile or compressive stress) than each other.

In some embodiments, another technique may include concurrently depositing first bow compensation layers onto the backside of the first and second substrates under the same process conditions to produce identical or nearly identical first bow compensation layers on the backside of the first and second substrates, and then adjusting the process conditions in the first and/or second station in order to deposit backside bow compensation layers on the first and second substrates with different properties, or to stop deposition on the backside of the second substrate. This may include stopping the backside deposition at the second station, as described above, by stopping the flow of precursor to the second substrate as well as stopping the plasma at the second station while maintaining it at the first station. This may also include adjusting the plasma power at the second station to slow the backside deposition or cause the deposition of a thinner layer of bow compensation material on the second substrate, adjusting the temperature at the first station to increase the thickness of the deposited bow compensation layer, and adjusting the temperature at the second station to decrease the thickness of the deposited bow compensation layer material.

The composition of the bow compensation layers depend on the wafer on which the layers are being deposited. For example, in some embodiments, the bow compensation layer may be a compressive film when deposited on a wafer having a compressive bow, or may be a tensile film when deposited on wafer with a tensile bow. Example materials for a compressive film to be deposited on the backside of the wafer include silicon oxide, silicon nitride, silicon, and carbon. Silanes may be used to deposit amorphous silicon as a compressive or tensile film. Acetylene, methane, ethylene, and other carbon-containing deposition precursors such as hydrocarbons may be used to deposit compressive carbon materials, or in some embodiments, neutral stress materials. The selection of deposition precursors and process conditions can be used to tune the stress of the bow compensation layer.

In some embodiments, the bow compensation layers may include a silicon oxide when depositing on the backside of a convex substrate (i.e., the lowest point is the edge of the wafer and the highest point is the center of the wafer) because the silicon oxide layer, in some embodiments, has properties that flatten out a convex-shaped wafer. In other embodiments, the bow compensation layer may include a silicon nitride when depositing on the backside of a concave substrate (i.e., the lowest point is the center of the wafer and the highest point is the edge of the wafer) because the silicon nitride layer, in some instances, has properties that flatten out a concave-shaped wafer.

"Silicon oxide" is referred to herein as including chemical compounds including silicon and oxygen atoms, including any and all stoichiometric possibilities for $Si_xO_y$, including integer values of x and y and non-integer values of x and y. For example, "silicon oxide" includes compounds having the formula $SiO_n$, where $1 \leq n \leq 2$, where n can be an integer or non-integer values. "Silicon oxide" can include sub-stoichiometric compounds such as $SiO_{1.8}$. "Silicon oxide" also includes silicon dioxide ($SiO_2$) and silicon monoxide (SiO). "Silicon oxide" also includes both natural and synthetic variations and also includes any and all crystalline and molecular structures, including tetrahedral coordination of oxygen atoms surrounding a central silicon atom. "Silicon oxide" also includes amorphous silicon oxide and silicates. Silicon oxide may also include trace amounts or interstitial amounts of hydrogen (SiOH). Silicon oxide may also include trace amounts of nitrogen, particularly if nitrogen gas is used as a carrier gas (SiON).

"Silicon nitride" is referred to herein as including any and all stoichiometric possibilities for $Si_xN_y$, including integer values of x and y and non-integer values of x and y; for example, a ratio X:Y may be 3:4. For example, "silicon nitride" includes compounds having the formula $SiN_n$, where $1 \leq n \leq 2$, where n can be an integer or non-integer values. "Silicon nitride" can include sub-stoichiometric compounds such as $SiN_{1.8}$. "Silicon nitride" also includes $Si_3N_4$ and silicon nitride with trace and/or interstitial hydrogen (SiNH) and silicon nitride with trace amounts of or interstitial oxygen (SiON) or both (SiONH). "Silicon nitride" also includes both natural and synthetic variations and also includes any and all lattice, crystalline, and molecular structures, including trigonal alpha-silicon nitride, hexagonal beta-silicon nitride, and cubic gamma-silicon nitride. "Silicon nitride" also includes amorphous silicon nitride and can include silicon nitride having trace amounts of impurities.

Accordingly, referring back to FIG. 1, the first and second substrates may have different bow shapes and the first and second bow compensation layers may have different compositions. In some embodiments, the first bow compensation layer of material and the second bow compensation layer of material include silicon nitride, and in some such instances, the first and second substrates may both have concave, but differently sized, bows. As provided herein, some embodiments may deposit a bow compensation layer having silicon nitride by contacting the backside of the substrates with ammonia and a silicon-containing precursor. In some embodiments, the first bow compensation layer of material and the second bow compensation layer of material include silicon oxide, and in some such instances, the first and second substrates may both have convex, but differently sized, bows. As provided herein, some embodiments may deposit a bow compensation layer having silicon oxide by contacting the backside of the substrates with nitrous oxide and a silicon-containing precursor.

Similarly, in some embodiments, the first bow compensation layer of material and the second bow compensation layer of material have internal compressive stress, while in some other embodiments, the first bow compensation layer of material and the second bow compensation layer of material have internal tensile stress.

In one example, ammonia and silane may be flowed to the process stations while igniting a single frequency plasma to achieve a silicon nitride film. In another example, silane and nitrous oxide may be flowed to the process stations to achieve a silicon oxide film.

Note that while silane is described herein as an example process gas, other silicon-containing gases may be used for depositing silicon-containing films, such as tetraethyl orthosilicate (TEOS). The selection of a silicon-containing precursor and reactants used as well as the plasma type (dual or single frequency) and process conditions may affect the stress of the film being deposited. For example, a mixture of silane and ammonia ignited using a single frequency radio frequency plasma such as a high frequency plasma may form a tensile silicon nitride film, while a mixture of silane and ammonia ignited using a dual frequency radio frequency plasma source may result in a compressive silicon nitride film. Additionally, a mixture of silane and nitrous oxide ignited using a single frequency plasma may result in a compressive silicon oxide film. Tensile silicon oxides may also be formed, such as by using TEOS and oxygen in some embodiments.

Silicon-containing precursors suitable for use in accordance with certain disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bi(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

In some embodiments, depositing the first bow compensation layer and the second bow compensation layer of material on the backside of the first substrate reduces the first substrate's by a first amount, and depositing the first bow compensation layer on the backside of the second substrate reduces the second substrate's bow by a second amount less than the first amount. In some instances, after these backside depositions, the first and second substrates may have the same, or substantially the same (e.g., within ±10% of each other), amount of bow. For example, when the first and second substrates are provided into the chamber and before any backside deposition is performed, the first bow of the first substrate may be between −30 μm and +30 μm, the second bow of the second substrate may also be between −30 μm and +30 μm, but less than the first bow. After depositing the first and second bow compensation layers on the backside of the first substrate, the first substrate's bow may be reduced to a bow that is between −10 μm and +10 μm, and after depositing the first bow compensation layer onto the backside of the second substrate, the second substrate's bow may also be reduced to between −10 μm and +10 μm. In some such embodiments, as stated above, the first substrates bow and the second substrate's bow may be within ±10%, ±5%, or ±1% of each other after the backside depositions.

In some other embodiments, when provided into the chamber, the first substrate's first bow may be between −300 μm and +300 μm, the second substrate's second bow may be between −300 μm and +300 μm and less than the first bow. After depositing the first and second bow compensation layers on the backside of the first substrate, the first substrate's bow may be reduced to a bow that is between −200 μm and +200 μm, and after depositing the first bow compensation layer onto the backside of the second substrate, the second substrate's bow may also be reduced to between −200 μm and +200 μm. In some such embodiments, as stated above, the first substrates bow and the second substrate's bow may be within ±10%, ±5%, or ±1% of each other after the backside depositions.

Figure 3A:
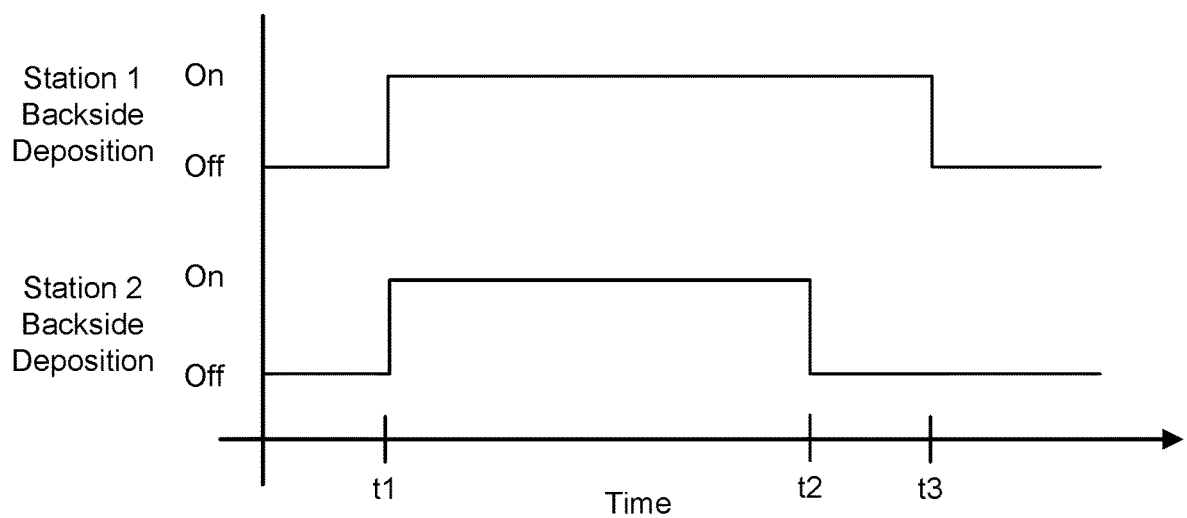
FIGS. 3A-3C depict basic sequences of operations according to disclosed embodiments.
Figure 3B:
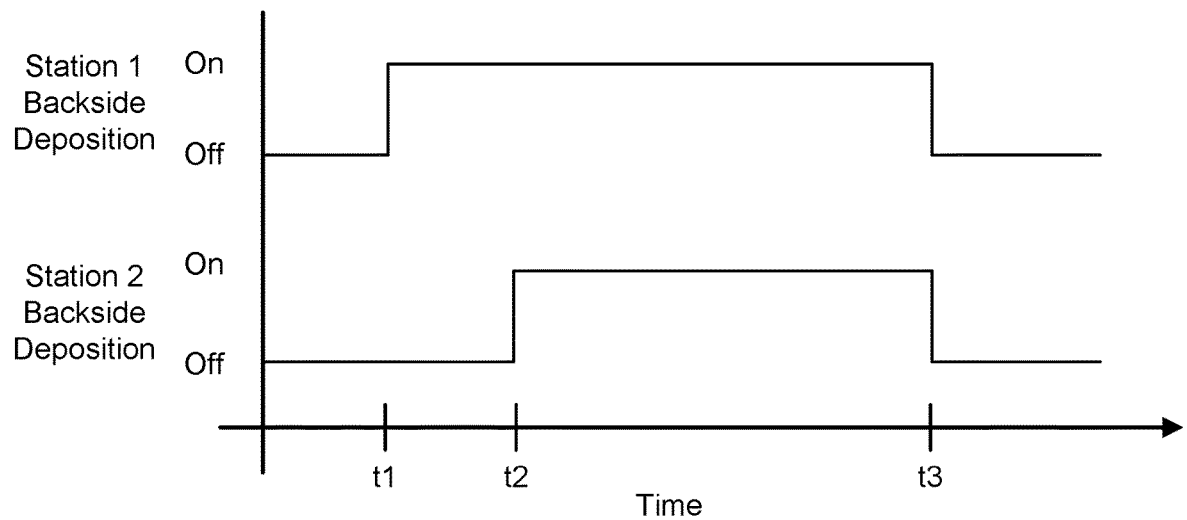
Figure 3C:
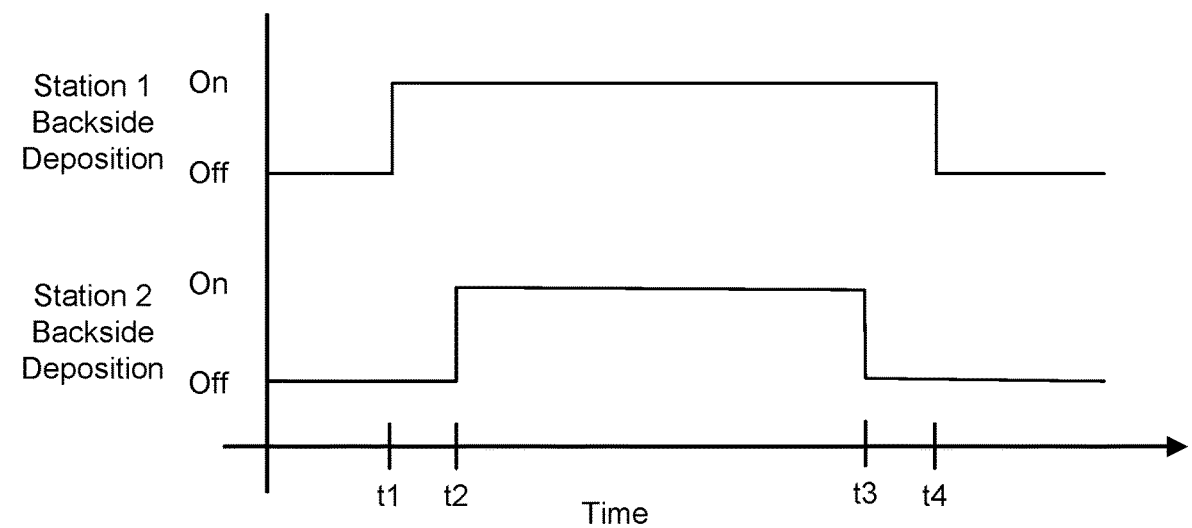

In some embodiments, the deposition of bow compensation layers with different thicknesses onto different substrates in the same chamber at the same time may be considered to occur by depositing bow compensation layers onto the backside of each substrate for a different time than with respect to the other substrate. For example, one bow compensation layer may be deposited onto the backside of one substrate for a first time and another bow compensation layer may be deposited onto the backside of the other substrate for a second time different than the first time and such that the depositing on the first and second substrates overlaps for some period of time. FIGS. 3A-3C depict basic sequences of operations according to disclosed embodiments. In some embodiments, as depicted in FIG. 3A, the backside deposition onto the two substrates may begin at the same time such that there is concurrent and overlapping backside deposition onto the two substrates; the backside deposition on the second substrate may be stopped before the backside deposition on the first substrate such that, for a period of time, backside deposition onto the first substrate occurs while no concurrent backside deposition on the second substrate is occurring. This deposits a thicker bow compensation layer of material on the first substrate. In FIG. 3A, the backside deposition onto the first substrate at station 1 and the second substrate at station 2 begins at the same time t1 and the backside deposition stops at time t2 such that the concurrent backside deposition onto the first and second substrates is occurring for the time period from t1 to t2.

From time t2 to time t3, only backside deposition is occurring on the first substrate at the station 1; no backside deposition is occurring on the second substrate during this time period.

In some other embodiments, as depicted in FIG. 3B, the backside deposition onto the first substrate may begin before the backside deposition on the second begins such that, for a period of time, backside deposition onto the first substrate occurs while no concurrent backside deposition on the second substrate is occurring. After this deposition has occurred for the period of time, the backside deposition onto the second substrate begins while the backside deposition on the first substrate continues such that concurrent backside deposition on the first and second substrates occurs for a second period of time. In some embodiments, at the end of this second period of time, the deposition onto the first and second substrates may both be stopped at the same time. This sequence deposits a thicker bow compensation layer of material on the first substrate. In FIG. 3B, the process begins with only backside deposition onto the first substrate at station 1 from time t1 to time t2; no backside deposition is occurring on the second substrate during this time period. After the time period from t1 to t2, at time t2 the backside deposition onto the second substrate at station 2 begins while the backside deposition at station 1 continues. This concurrent deposition at station 1 and station 2 continues from time t2 to time t3 at which point both backside depositions are stopped.

In some embodiments, like depicted in FIG. 3C, the backside deposition onto the first substrate may begin before and end after the backside deposition on the second substrate. Here, for a period of time, backside deposition onto the first substrate first occurs while no concurrent backside deposition on the second substrate is occurring, after which backside deposition on the second substrate begins such that concurrent backside deposition occurs for a second period of time. After this concurrent deposition time, the backside deposition on the second substrate is stopped while the backside deposition on the first substrate continues. This sequence also deposits a thicker bow compensation layer of material on the first substrate. In FIG. 3C, the process begins with only backside deposition onto the first substrate at station 1 from time t1 to time t2; no backside deposition is occurring on the second substrate during this time period. After the time period from t1 to t2, at time t2 the backside deposition onto the second substrate at station 2 begins while the backside deposition at station 1 continues. This concurrent deposition at station 1 and station 2 continues from time t2 to time t3 at which point the backside deposition on the second substrate at station 2 is stopped, but the backside deposition on the first substrate at station 1 continues. From time t3 to time t4, only backside deposition onto the first substrate at station 1 is occurring and no backside deposition is occurring on the second substrate.

In some embodiments, concurrently depositing the first bow compensation layer onto the first and second substrates may be performed for a time range between 60 seconds and 2,000 seconds. The depositing the second bow compensation layer on the backside of the first substrate may be performed for a time range between 60 seconds and 2,000 seconds.

In certain disclosed embodiments, deposition of the backside bow compensation layer is performed at a substrate temperature greater than 300° C., or between about 300° C. and about 550° C., or about 300° C. Higher temperatures may be used in some embodiments to achieve higher stress, or may be used to increase stability of the film deposited. In some embodiments, the showerhead temperature is set to a temperature greater than 300° C., or between about 300° C. and about 550° C., or about 330° C.

As noted above, the number of layers and/or the thickness of the films deposited in a bow compensation layer can also affect the wafer bow of the film. For example, to achieve a bow change of between about −200 μm and about −300 μm (such as to change a wafer having a warpage of +1000 μm to +800 μm (a change of −200 μm)), a film can be deposited to a thickness between 10000 Å and 15000 Å to achieve the desired bow change. Likewise, to achieve a bow change of between about +200 μm and about +300 μm (such as to change a wafer having a warpage of −400 μm to −200 μm (a change of −200 μm)), a film can be deposited to a thickness between 6000 Å and about 10000 Å to achieve the desired bow change.

In some embodiments, the techniques may include the measurement of a substrate's bow and based on this measurement, a determination of the amount of deposition time required to reduce this substrate's measured bow by a particular amount or below a particular threshold. For example, before or after the substrate is loaded into the chamber and before any backside deposition is performed, the substrate's bow may be measured to be −30 μm, and based on this measurement, a determination may be made as to the time required for depositing a backside bow compensation layer that reduces the −30 μm bow to within a desired range of ±10 μm, for example. This backside deposition may then be performed for that determined time. The measurement of a substrate's bow may be performed by an optical technique that may use optical sensors such as cameras or lasers to determine the bow amount. For example, the topography, i.e., the bow, of the wafer can be measured by lasers to obtain the Z height of the wafer at multiple points on the wafer. This measurement may be relatively quick, e.g., less than 5 seconds per wafer, which may not adversely affect throughput, in some instances.

The determination may be based on an experimental or calculated relationship between deposition time and amount of bow compensated by the time. The experimental relationship may be based on data of previously processed wafers and the deposition parameters are uniform between the experimental depositions and those used to deposit the backside bow compensation layers on substrates generally, except that the experimental depositions are performed for various times.

The data gathered during experimental backside deposition may include various parameters, such as the thickness of a deposited backside bow compensation layer on a substrate, the amount of bow caused by the bow compensation layer, and the deposition time for producing that backside bow compensation layer. As noted above, the amount of bow may vary substantially linearly with respect to the bow compensation thickness layer and deposition time, such that the longer the deposition is performed, the thicker the bow compensation layer becomes and the more bow that layer causes and thus can compensate for. After each deposition, the amount of the bow is measured and the deposition time is known for producing this bow, thereby associating a bow compensation amount with a corresponding deposition time.

Figure 4:
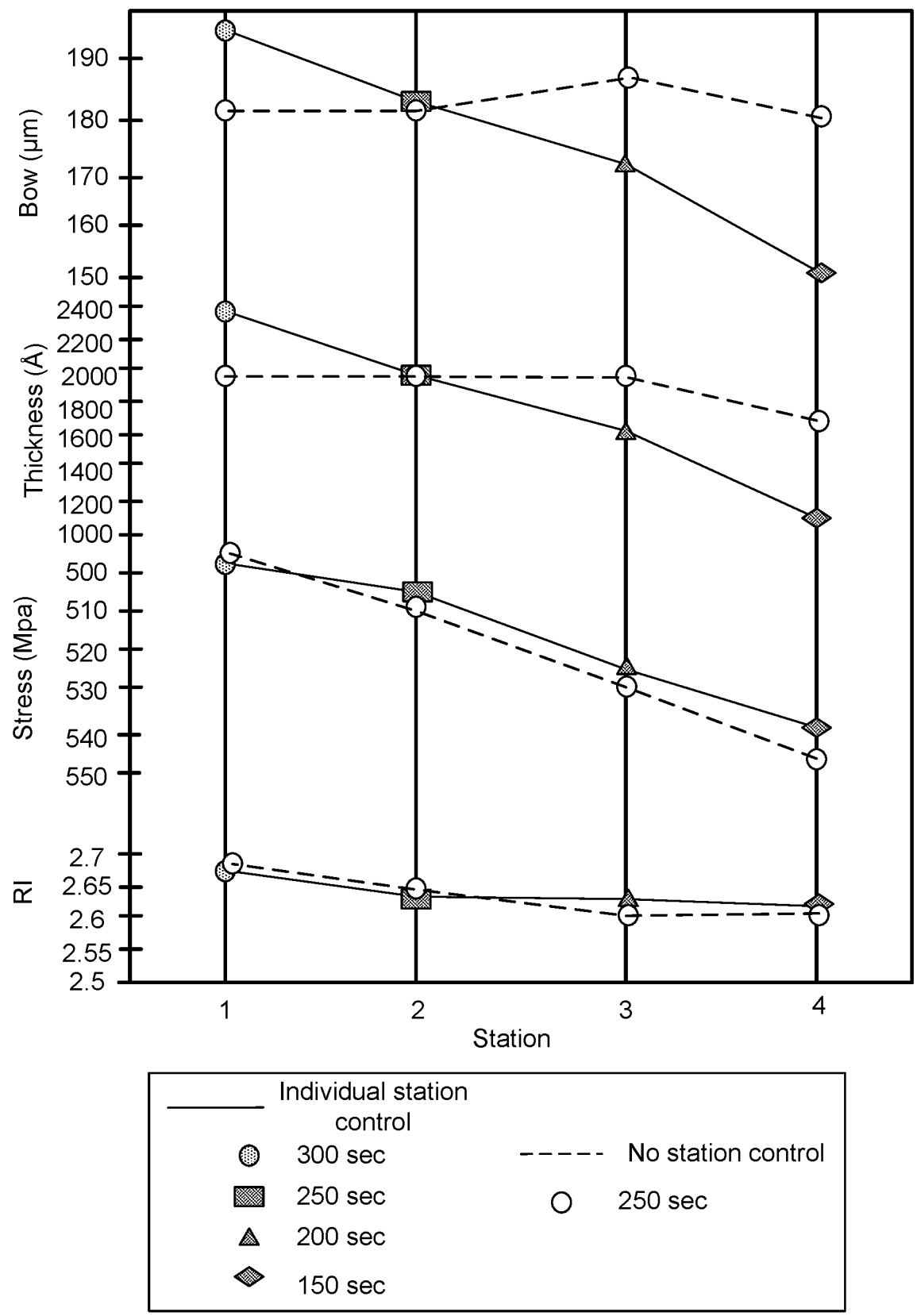
FIG. 4 depicts experimental data in which backside deposition was performed on eight substrates.

A relationship between deposition time and bow compensation amount can be characterized based on the data, for example by plotting backside bow compensation layer deposition time vs. bow compensation, as shown in FIG. 4. The data in FIG. 4 may be considered experimental data in which backside deposition was performed on eight substrates. Four substrates had individual station control of the backside bow compensation layer deposition timing while the other four had the same, constant backside bow compensation layer deposition time. For the individual station control, one substrate at station 1 received 300 seconds of backside bow compensation layer deposition (the shaded circle), a second substrate at station 2 received 250 seconds of backside bow compensation layer deposition (the shaded rectangle), a third substrate at station 3 received 200 seconds of backside bow compensation layer deposition (the shaded triangle), and a fourth substrate at station 4 received 150 seconds of backside bow compensation layer deposition (the shaded diamond). As can be seen, the longest backside bow compensation layer deposition, 300 seconds, resulted in the largest bow amount and thus bow compensation amount, approximately 195 µm, as well as the largest layer thickness, approximately 2400 Å, while the shortest backside bow compensation layer deposition, 150 seconds, resulted in the least bow amount, approximately 155 µm, and thus smallest bow compensation amount as well as the smallest thickness, approximately 1200 Å. Accordingly, this data shows the monotonic relationship between deposition time, bow amount and compensation, and backside bow compensation layer thickness. In comparison, the four substrates that received the same 250 seconds of backside bow compensation layer deposition resulted in substantially the same bow compensation thickness amounts, as seen with their linear profiles. As also seen in FIG. 4, the different bow compensation layer deposition times advantageously controlled different amount of bow compensation on the wafer while maintaining the frontside film properties of stress and reflective index (RI).

The data of the measured bow amounts, like those in FIG. 4, may be used to develop the relationship between backside deposition time and the resulting bow compensation amount. For example, modeling may be used to quantify the relationship between the measured bow amount and the deposition time. For example, a polynomial fit or regression may be applied to the measured bow amount and deposition time data in order to determine the change in bow amount with respect to deposition over the course of processing a substrate. In some embodiments, like in FIG. 4, the independent variable may be deposition time and the dependent variable may be the measured bow amount. The polynomial fit may be a one-degree polynomial, i.e., a linear equation, and may also be a second or third degree polynomial such as $y = x^3 * \beta_3 + x^2 * \beta_2 + x * \beta_1 + \beta_0$, with x as the deposition time and y as the measured bow amount. Applying a fit or regression to this data may return values of the constants of the fit, such as $\beta_3$, $\beta_2$, $\beta_1$, and $\beta_0$ of the example equation herein.

Once the relationship between bow amount, i.e., the amount of bow caused by the deposited backside bow compensation layer, and deposition time is obtained, a specific deposition time for a measured bow of other substrates can be obtained. By knowing the measured amount of bow on a substrate, the relationship between the experimental bow amount and deposition time can be used to determine the deposition time required to reduce the measured amount of bow.

Figure 5:
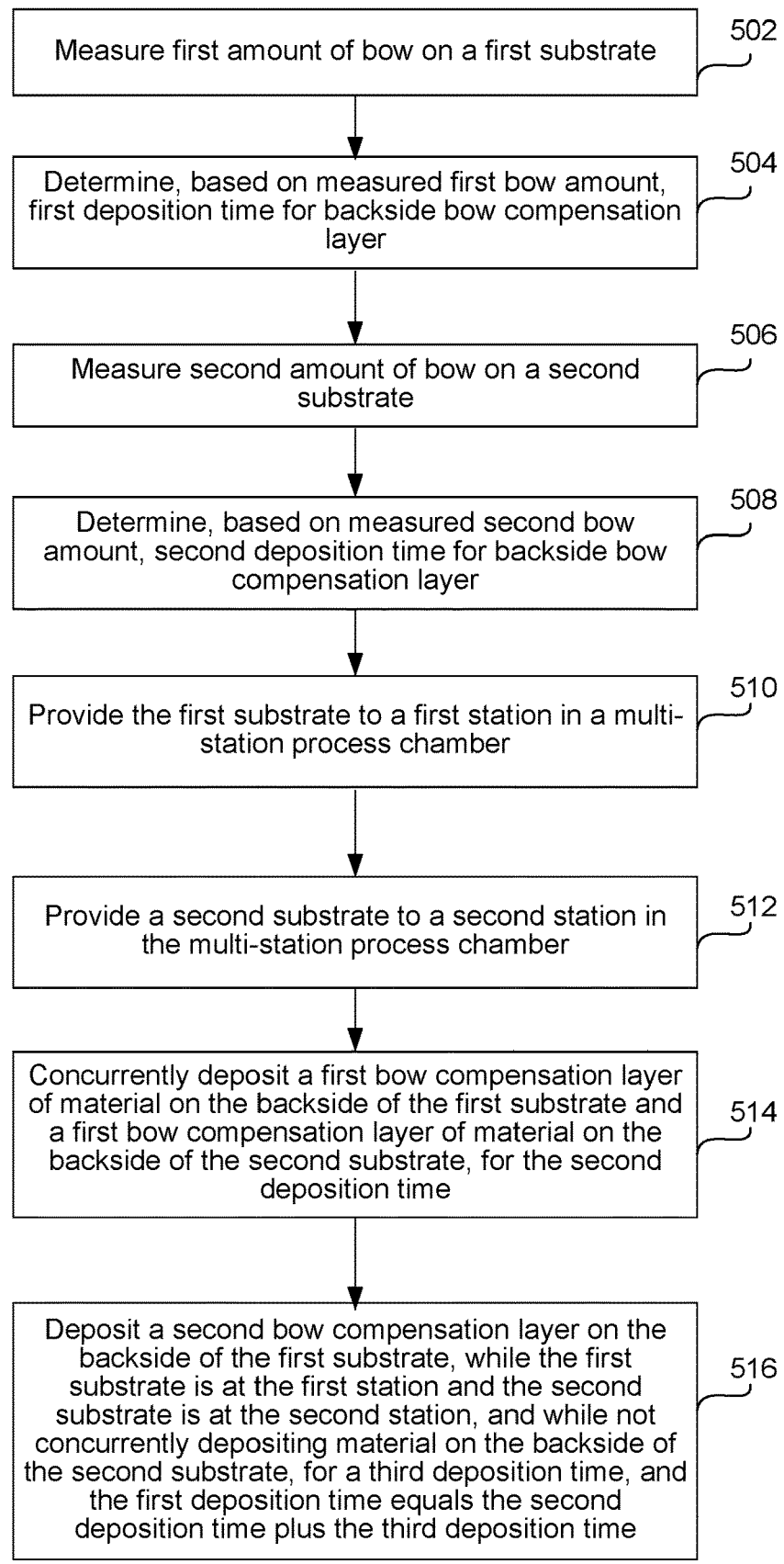
FIG. 5 depicts a flowchart for an example technique for measuring a bow amount and determining the backside bow compensation layer deposition time for that substrate.

FIG. 5 depicts a flowchart for an example technique for measuring a bow amount and determining the backside bow compensation layer deposition time for that substrate. In operation 502, a first amount of bow is measured on the first substrate and in operation 504, a determination is made, based on that measured first amount of bow, of a first deposition time for a backside bow compensation layer that can reduce the measured first bow amount below a first threshold. Similarly, operation 506 measures a second amount of bow on the second substrate and in operation 508, a determination is made, based on that measured second amount of bow, of a second deposition time for a backside bow compensation layer that can reduce the measured second bow amount below the first threshold. In some embodiments, the measured first bow amount is greater than the measured second bow amount. In operations 510 and 512 the substrates are provided to the respective stations as described above.

In the determination of operations 504 and 508, once the known, measured amount of bow is determined, that value may be applied to a relationship between (i) the amount of deposition time required to reduce that measured bow by a particular amount, including below a threshold, and (ii) a variable representing an amount of bow that is to be reduced. These values may be determined before the processing of the batch, such as computationally and/or in the experimental/calibration batch. The relationship to which the known amount of bow, or a parameter derived therefrom, is applied may be a polynomial relationship, including a one-degree polynomial, such as a polynomial fit derived as described above. This relationship returns the determined deposition time given the measured bow amount.

In operations 514 and 516, backside bow compensation layers are deposited on the first and second substrates for the different, determined times such that the first substrate receives a longer backside deposition than the second substrate. Because the backside deposition time for the second substrate is shorter than the backside deposition time for the first substrate, the concurrent deposition on both substrates is performed only for the second deposition time, as provided in operation 514. The backside deposition of the first substrate is performed for the additional time that is the difference between the first and second deposition times. For example, if the first deposition time is 300 seconds, and the second deposition time is 250 seconds, the concurrent deposition of operation 514 may be performed for 250 seconds, and the backside deposition on only the first substrate of operation 516 may be performed for 50 seconds, thereby resulting in the first substrate receiving the total first deposition time of total 300 seconds (250 seconds plus 50 seconds) and the second substrate receiving only the second deposition time of 250 seconds.

In some embodiments, bow measurements of the wafers may be performed in an experimental or calibration set which are used in subsequent processing for selecting wafers for bow compensation deposition that have similar bows. For example, a plurality of wafers may be processed before, or upstream of, the bow compensation deposition and all of wafers in this plurality may be measured to determine their bows following that processing. Determinations may then be made as to which wafers have similar bows to each other, such as determining whether one wafer is within a particular threshold of all the other wafers. Based on these determinations, wafers having bows that are similar to each other, or within the threshold, may be grouped together for concurrent bow compensation deposition processing in the multi-station chamber. For example, the plurality of wafers may have 10 wafers that undergo frontside processing and are all measured to determine their bow prior to the backside bow compensation deposition described herein. Following this measurement, determinations are made as to how similar the bow on each wafer is to the other wafers in the plurality in order to group the wafers together with the other wafers having the most similar bow. These grouped wafers may then receive concurrent backside bow compensation deposition in the same chamber at the same time. For instance, for a four station multi-station backside deposition chamber, wafers 1, 5, 8, and 10 may have the closest bows to each other and thus may be grouped together and concurrently receive backside bow compensation deposition in the same chamber. This may further increase throughput.

The techniques and apparatuses described herein provide numerous benefits.

Throughput is improved by being able to process wafers with different bow amounts in the same chamber at the same time, instead of processing these substrates individually. Wafers also receive the appropriate amount of backside bow compensation material in order for the wafers to be subsequently processed.

Apparatus

Disclosed embodiments may be performed in any suitable apparatus or tool. An apparatus or tool may include one or more process stations. Described below are an example process station and tool that may be used in some embodiments.

Figure 6:
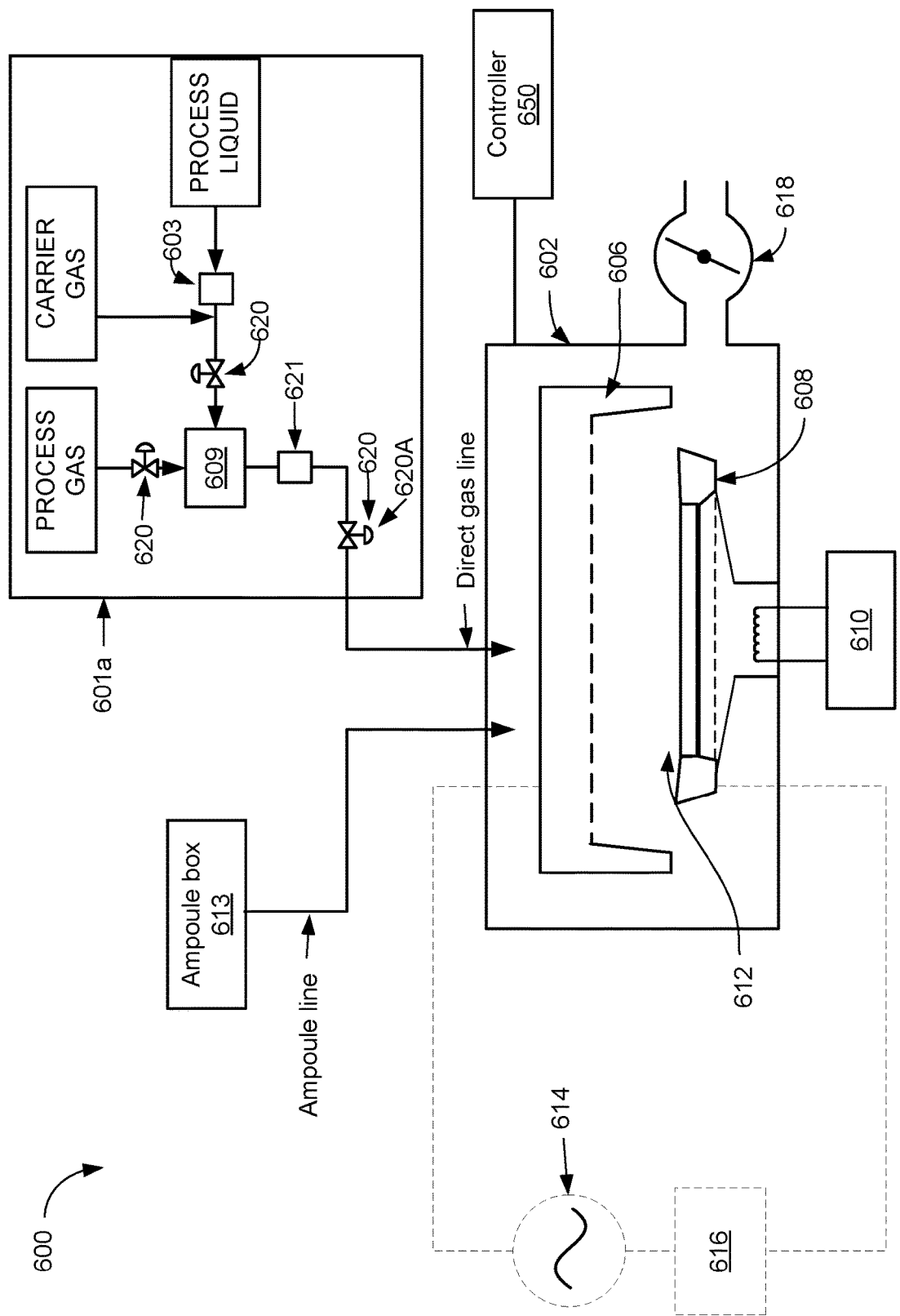
FIG. 6 depicts a schematic illustration of an embodiment of plasma-enhanced chemical vapor deposition (PECVD) process station.
Figure 7:
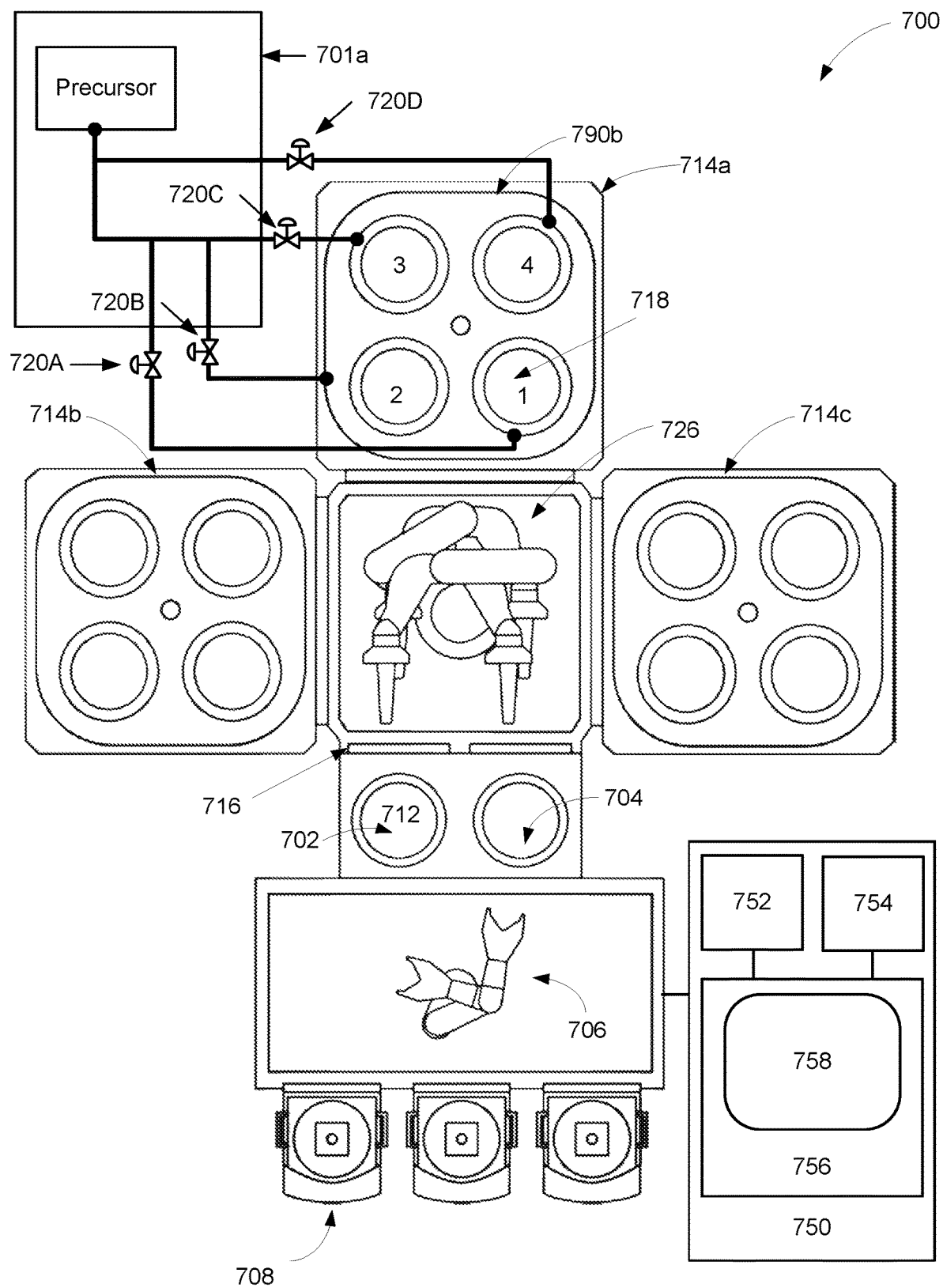
FIG. 7 depicts an embodiment of a multi-station processing tool.

FIG. 6 depicts a schematic illustration of an embodiment of plasma-enhanced chemical vapor deposition (PECVD) process station 600 having a process chamber body 602 capable of maintaining a low pressure environment and performing backside deposition of bow compensation layers onto a substrate. A plurality of PECVD process stations 600 may be included in a common low pressure process tool environment. For example, FIG. 7 depicts an embodiment of a multi-station processing tool 700 capable of performing backside deposition of bow compensation layers onto multiple substrates that are in the same chamber at the same time. In some embodiments, one or more hardware parameters of PECVD process station 600, including those discussed in detail below, may be adjusted programmatically by one or more computer controllers 650.

PECVD process station 600 fluidly communicates with gas delivery system 601a for delivering process gases to a distribution showerhead 606. Reactant delivery system 601a includes a mixing vessel 604 for blending and/or conditioning process gases for delivery to showerhead 606. Process gases such as those used to deposit a bow compensation layer on a substrate may be delivered to the process chamber body 602 via showerhead 606 using the reactant delivery system 601a. In some embodiments, reactive species may be delivered using the reactant delivery system 601a. One or more mixing vessel inlet valves 620 may control introduction of process gases to mixing vessel 604. These valves may be controlled depending on whether a gas may be turned on during various operations. As stated above, valves 620 may be used to control the flow of gases, including the precursor, to each of the stations in the apparatus, including each station in the camber of tool 700. For example, the when valve 620A is closed, the precursor may not flow to the processing station and when valve 620A is open, the precursor may be allowed to flow to the processing station. Additionally, flow control element 621, which may be a mass flow controller, may cause process gases to flow to the processing station.

Note that in some embodiments, a liquid reactant may not be used. However in some embodiments, a liquid reactant may be used to form a tensile or compressive film as described herein. As an example, the embodiment of FIG. 6 includes a vaporization point 603 for vaporizing liquid reactant to be supplied to the mixing vessel 604. In some embodiments, vaporization point 603 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant before or after vaporizing a reactant. However, purging the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100° C. to approximately 150° C. at mixing vessel 604.

In some embodiments, liquid precursor or liquid reactant, such as a silicon-containing precursor, may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller (LFC) (not shown) upstream of vaporization point 603 may be provided for controlling a mass flow of liquid for vaporization and delivery to process station 600. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for flowing a liquid reactant. Thus, in some embodiments, the LFC may be dynamically switched between a feedback control mode and a direct control mode. In some embodiments, this may be performed by disabling a sense tube of the LFC and the PID controller.

Showerhead 606 distributes gases toward substrate 612. For example, showerhead 606 may distribute process gases for depositing a bow compensation layer to the backside of the substrate 612 in various operations, such as silicon-containing gases and/or oxygen-containing or nitrogen-containing gases. In the embodiment shown in FIG. 6, the substrate 612 is located beneath showerhead 606 and is shown resting on a pedestal 608. The pedestal 608 may include wafer holders to hold a wafer by the edges and a bottom showerhead (not shown) for delivering gases to the backside of a wafer. Showerhead 606 may have any suitable shape, and may have any suitable number and arrangement of ports for distributing process gases to substrate 612.

In another scenario, adjusting a height of pedestal 608 may allow a plasma density to be varied during disclosed processes such that the plasma density between the wafer and the bottom showerhead is varied. For example, the plasma may be activated when process gases are flowed to the chamber body 602. At the conclusion of the process, pedestal 608 may be lowered during another substrate transfer phase to allow removal of substrate 612 from pedestal 608.

In some embodiments, showerhead 606 and pedestal 608 electrically communicate with a radio frequency (RF) power supply 614 and matching network 616 for powering a plasma. In some embodiments, the plasma energy may be controlled by controlling one or more of a process station pressure, gas concentrations and partial pressures of gases or gas flow rates, an RF source power, and an RF source frequency. For example, RF power supply 614 and matching network 616 may be operated at any suitable power to form a plasma having a desired composition of radical species. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for a reaction for depositing a bow compensation layer.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of one or more gases (e.g., a silicon-containing gas and a nitrogen-containing gas), and time delay instructions for the first recipe phase. A second, subsequent recipe phase may include instructions for setting a flow rate of a purge gas and time delay instructions for the second recipe phase. Alternatively, a third recipe phase may include instructions for setting a flow rate of one or more gases (e.g., a silicon-containing gas and an oxygen-containing gas), and time delay instructions for the third recipe phase. It will be appreciated that these recipe phases may be further subdivided and/or iterated in any suitable way within the scope of the present disclosure. Controller 650 may also include any of the features described below with respect to controller 750 in FIG. 7.

In some embodiments, pedestal 608 may be temperature controlled via heater 610.

Heater 610 may be used to anneal the substrate. For example, in some embodiments, during annealing, the heater 610 may be set to a temperature of at least about 450° C. Further, in some embodiments, pressure control for process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to the process station 600.

As described above, one or more process stations may be included in a multi-station processing tool in order to perform backside deposition of bow compensation layers onto substrates at each station in the multi-station chamber of the tool. FIG. 7 shows a schematic view of an embodiment of a multi-station processing tool 700 with an inbound load lock 702 and an outbound load lock 704, either or both of which may include a remote plasma source. A robot 706, at atmospheric pressure, is configured to move wafers from a cassette loaded through a pod 708 into inbound load lock 702 via an atmospheric port (not shown). A wafer or substrate is placed by the robot 706 on a pedestal 712 in the inbound load lock 702, the atmospheric port is closed, and the load lock is pumped down. Where the inbound load lock 702 includes a remote plasma source, the wafer may be exposed to a remote plasma treatment in the load lock prior to being introduced into one of the processing chambers such as processing chamber 714a. Further, the wafer also may be heated in the inbound load lock 702 as well, for example, to remove moisture and adsorbed gases. Next, a chamber transport port 716 to processing chamber 714a is opened, and another robot 726 places the wafer into the reactor on a pedestal 718 of a first station (labeled 1) of processing chamber 714a shown in the reactor for processing. While the embodiment depicted in FIG. 7 includes load locks, it will be appreciated that, in some embodiments, direct entry of a wafer into a process station may be provided.

Each of the depicted processing chambers, such as processing chamber 714a, includes four process stations. Each station has a heated pedestal, and gas line inlets. It will be appreciated that in some embodiments, each process station may have different or multiple purposes. For example, a process station may be used to deposit backside bow compensation layers, that may in some embodiments include a tensile or compressive material by PECVD. While the depicted processing chamber 714a includes four stations, it will be understood that a processing chamber according to certain disclosed embodiments may have any suitable number of stations. For example, in some embodiments, a processing chamber may have five or more stations, while in other embodiments a processing chamber may have three or fewer stations. Additionally, while the depicted processing tool 700 has three processing chambers 714a, 714b, and 714c, it will be understood that a processing tool according to certain disclosed embodiments may have any suitable number of processing chambers.

FIG. 7, similar to FIG. 6, the tool 700 includes a gas delivery system that is configured to deliver gas to each station in the tool. For simplicity, gas delivery system 701a is depicted as containing a precursor sources and fluidic connections, i.e., fluid conduits, to the four stations in chamber 714a. Here, tool 700 is able to exert individual station-to-station control of the gas flow to each processing chamber in the station 714a in order to individually control the deposition at each station. One or more valves may control the flow of gases to each station. As illustrated, valve 720A controls the flow of precursor to station 1, valve 720B controls the flow of precursor to station 2, valve 720C controls the flow of precursor to station 3, and valve 720D controls the flow of precursor to station 4. One each of these valves is open, precursor is allowed to flow to its respective station and conversely, when each valve is closed, precursor is not allowed to flow to the respective station. Accordingly, the gas delivery system 701a can control the flow of precursor to each station such that backside deposition can occur at each station in chamber 714a for different amounts of time.

In some embodiments, the gas delivery system may exert station-to-station flow control in other manners. For example, this may include individual MFCs for each station and adjustable orifices for each station that enable the gas flow to each station to be controlled. This control includes the start and stop of gas flow to each individual station, as well as control of the flowrate to each station. In some such embodiments, each station may include its own corresponding MFC that causes gas to flow to that single station and the techniques described may start and stop the flow of precursor to each station by causing the MFCs to flow or not to flow gas to each station. For example, the apparatus may include a first MFC fluidically connected and configured to flow gas to the first station and a second MFC fluidically connected and configured to flow gas to the second station, and operation 106 of FIG. 1 may begin by causing the first and the second MFCs to concurrently flow gas to the first and second stations. Operation 106 may end by causing the second MFC to stop flowing gas to the second station while concurrently causing the first MFC to continue flowing gas to the first station and thus simultaneously start operation 108; during operation 108, the second MFC, or another other MFC, is not causing gas to flow to the second station. Operation 108 may end by causing the first MFC to stop flowing gas to the first station.

FIG. 7 depicts an embodiment of a wafer handling system 790 for transferring wafers within processing chamber 714a. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the transfer of wafers into and out of a process chamber, rotating wafers within a process chamber, aligning wafers with the showerhead in a process chamber, transfer of wafers into and out of a process chamber, timing of gases out of particular regions of a showerhead, mixture of gases, amount of gas flow out of particular regions of a showerhead, chamber and/or station pressure, backside gas flow pressure out of particular regions of a showerhead, chamber and/or reactor temperature, wafer temperature, bias power, target power levels, RF power levels and type (such as single frequency or dual frequency or high frequency or low frequency), pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, electrostatic chuck power control program, and a plasma control program.

A substrate positioning program may include program code for process tool components that are used to load the substrate onto pedestal 718 and to control the spacing between the substrate and other parts of process tool 700. A process gas control program may include code for controlling gas composition (e.g., conditioning process gases, deposition gases, helium gas or other gas for backside flow, carrier gases, etc., as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, pressure of gas introduced to backside of a wafer during conditioning operations, etc.

A heater control program may include code for controlling the current to a heating unit that is used to heat the substrate for annealing operations described herein. Alternatively, the heater control program may control delivery of a heat transfer gas (such as helium) to the substrate. A plasma control program may include code for setting RF power levels applied to the process electrodes in one or more process stations in accordance with the embodiments herein. A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above described deposition processes. The program instructions may control a variety of process parameters, such as DC power level, RF bias power level, pressure, temperature, etc. The instructions may control the parameters to operate in-situ deposition of films according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases and/or inhibitor gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 750 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some implementations, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD or PECVD chamber or module, an ALD or PEALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 750 also includes appropriate control logic, or non-transitory machine readable instructions, for performing any of the techniques described herein. This includes instructions for causing substrates to be loaded to each station the chambers, causing the gas delivery system to concurrently flow the precursor onto the backside of a first substrate at a first station and onto the backside of a second substrate at a second station, and thereby concurrently deposit a first bow compensation layer of material on the backside of the first substrate and a first bow compensation layer of material on the backside of the second substrate, and causing the gas delivery system to flow the precursor onto the backside of the first substrate at the first station, and thereby deposit a second bow compensation layer of material on the backside of the first substrate, while causing the gas delivery system to not concurrently flow the precursor onto the backside of the second substrate at the second station and not deposit a material on the backside of the second substrate.

The present disclosure also includes additional and/or alternative implementations. Implementation 1: A method comprising: providing a first substrate to a first station in a semiconductor processing chamber; providing a second substrate to a second station in the semiconductor processing chamber; concurrently depositing a first bow compensation layer of material having a property with a first value on the backside of the first substrate at the first station under a first set of process conditions, and a second bow compensation layer of material having the property with a second value on the backside of the second substrate at the second station under a second set of process conditions different than the first set of process conditions, wherein the first value of the property of the first bow compensation layer of material is different than the second value of the property of the second bow compensation layer of material.

Implementation 2: The method of implementation 1, wherein the property is thickness, and the first value is greater than the second value.

Implementation 3: The method of implementation 1, wherein the property is compressive stress.

Implementation 4: The method of implementation 1, wherein the property is tensile stress.

Implementation 5: The method of implementation 1, wherein the first set of process conditions has a first duration and the second set of process conditions has a second duration less than the first duration.

Implementation 6: The method of implementation 1, wherein the first set of process conditions has a first temperature and the second set of process conditions has a second temperature different than the first temperature.

Implementation 7: The method of implementation 1, wherein the first set of process conditions has a first precursor flowrate and the second set of process conditions has a second precursor flowrate different than the first precursor flowrate.

Implementation 8: The method of implementation 1, wherein the first set of process conditions has a first plasma power and the second set of process conditions has a second plasma power different than the first plasma power.

Implementation 9: A method comprising: providing a first substrate to a first station in a semiconductor processing chamber; providing a second substrate to a second station in the semiconductor processing chamber; concurrently depositing a first bow compensation layer of material on the backside of the first substrate at the first station under a first set of process conditions and a first bow compensation layer of material on the backside of the second substrate at the second station under the first set of process conditions; adjusting the process conditions at the second station to a second set of process conditions that is different than the first set of process conditions; and concurrently depositing a second bow compensation layer of material on the backside of the first substrate at the first station under the first set of process conditions, and a third bow compensation layer of material on the backside of the second substrate at the second station under the second set of process conditions, wherein the second bow compensation layer of material is different than the third bow compensation layer of material.

Implementation 10: The method of implementation 9, wherein the adjusting further comprises changing the plasma power at the second station.

Implementation 11: The method of implementation 9, wherein the adjusting further comprises changing the temperature at the second station.

Implementation 12: The method of implementation 9, wherein the adjusting further comprises changing the precursor flowrate at the second station.

Implementation 13: A system for performing backside deposition onto substrates, the system comprising: a gas delivery system comprising a precursor gas source; a processing chamber that includes at least two stations, wherein each station is fluidically connected to the gas delivery system and configured to flow a precursor onto the backside of a substrate at that station; and a controller for controlling the system and comprising control logic for: causing the gas delivery system to concurrently flow the precursor onto the backside of the first substrate at the first station and onto the backside of the second substrate at the second station, and thereby concurrently deposit a first bow compensation layer of material on the backside of the first substrate and a first bow compensation layer of material on the backside of the second substrate, and causing the gas delivery system to flow the precursor onto the backside of the first substrate at the first station, and thereby deposit a second bow compensation layer of material on the backside of the first substrate, while causing the gas delivery system to not concurrently flow the precursor onto the backside of the second substrate at the second station and not deposit a material on the backside of the second substrate.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a first substrate to a first station in a semiconductor processing chamber;
providing a second substrate to a second station in the semiconductor processing chamber;
concurrently depositing a first bow compensation layer of material on the backside of the first substrate at the first station and a first bow compensation layer of material on the backside of the second substrate at the second station; and
depositing a second bow compensation layer of material on the backside of the first substrate, while the first substrate is at the first station and the second substrate is at the second station, and while not concurrently depositing material on the backside of the second substrate.

2. The method of claim 1, wherein:
the concurrently depositing the first bow compensation layer of material on the backside of the first substrate and on the backside of the second substrate further comprises concurrently flowing a precursor onto the backside of the first substrate at the first station and onto the backside of the second substrate at the second station, and the depositing the second bow compensation layer of material on the backside of the first substrate further comprises flowing the precursor onto the backside of the first substrate at the first station while not concurrently flowing the precursor onto the backside of the second substrate.

3. The method of claim 1, wherein:

the depositing the first bow compensation layer of material and the second bow compensation layer of material on the backside of the first substrate reduces a first bow of the first substrate by a first amount, and the depositing the first bow compensation layer of material on the backside of the second substrate reduces a second bow of the second substrate by a second amount less than the first amount.

4. The method of claim 1, wherein:

the first substrate is bowed with a first bow when provided to the first station, and the second substrate is bowed with a second bow that is less than the first bow when provided to the second station.

5. The method of claim 4, wherein:

the first bow is between −30 μm and +30 μm, the second bow is between −30 μm and +30 μm and less than the first bow, after the depositing the first bow compensation layer of material and the second bow compensation layer of material on the backside of the first substrate, the first substrate has a third bow that is between −10 μm and +10 μm, and after the depositing the first bow compensation layer of material onto the backside of the second substrate, the second substrate has a fourth bow that is between −10 μm and +10 μm.

6. The method of claim 4, wherein:

the first bow is between −300 μm and +300 μm, the second bow is between −300 μm and +300 μm and less than the first bow, after the depositing the first bow compensation layer of material and the second bow compensation layer of material on the backside of the first substrate, the first substrate has a third bow that is between −200 μm and +200 μm, and after the depositing the first bow compensation layer of material onto the backside of the second substrate, the second substrate has a fourth bow that is between −200 μm and +200 μm.

7. The method of claim 1, wherein the concurrently depositing the first bow compensation layer on the backside of the first substrate and on the backside of the second substrate is performed before the depositing the second bow compensation layer on the backside of the first substrate while not concurrently depositing material on the backside of the second substrate.

8. The method of claim 7, further comprising:

stopping, after the concurrently depositing the first bow compensation layer on the backside of the first substrate and on the backside of the second substrate, the depositing of the first bow compensation layer on the second substrate, wherein:

material is continuously deposited on the backside of the first substrate during and between the concurrently depositing and the depositing the second layer of material on the backside of the first substrate.

9. The method of claim 8, wherein:

the concurrently depositing the first bow compensation layer of material on the backside of the first substrate and on the backside of the second substrate further comprises concurrently flowing a precursor onto the backside of the first substrate at the first station and onto the backside of the second substrate at the second station, the depositing the second bow compensation layer of material on the backside of the first substrate further comprises flowing the precursor onto the backside of the first substrate at the first station while not concurrently flowing the precursor onto the backside of the second substrate, the stopping further comprises stopping the flow of the precursor onto the backside of the second substrate, and the precursor is continuously flowed onto the backside of the first substrate during and between the concurrently depositing and the depositing the second layer of material on the backside of the first substrate.

10. The method of claim 1, wherein the depositing the second bow compensation layer on the backside of the first substrate while not concurrently depositing material on the backside of the second substrate is performed before the concurrently depositing the first bow compensation layer on the backside of the first substrate and on the backside of the second substrate.

11. The method of claim 10, further comprising:

starting, after the depositing of the first bow compensation layer on the second substrate while not concurrently depositing material on the backside of the second substrate, the concurrently depositing the first bow compensation layer on the backside of the first substrate and on the backside of the second substrate, wherein:

material is continuously deposited on the backside of the first substrate during and between the concurrently depositing and the depositing the second layer of material on the backside of the first substrate.

12. The method of claim 11, wherein:

the concurrently depositing the first bow compensation layer of material on the backside of the first substrate and on the backside of the second substrate further comprises concurrently flowing a precursor onto the backside of the first substrate at the first station and onto the backside of the second substrate at the second station, the depositing the second bow compensation layer of material on the backside of the first substrate further comprises flowing the precursor onto the backside of the first substrate at the first station while not concurrently flowing the precursor onto the backside of the second substrate, the starting further comprises starting the flow of the precursor onto the backside of the second substrate, and the precursor is continuously flowed onto the backside of the first substrate during and between the concurrently depositing and the depositing the second layer of material on the backside of the first substrate.

13. The method of claim 1, wherein the first bow compensation layer of material and the second bow compensation layer of material comprise silicon nitride.

14. The method of claim 13, wherein:

the first substrate is bowed with a first concave bow when provided to the first station, and the second substrate is bowed with a second concave bow when provided to the second station.

15. The method of claim 13, wherein:
the depositing the first bow compensation layer of material on the backside of the first substrate and on the backside of the second substrate further comprises contacting the backside of the substrates with ammonia and a silicon-containing precursor, and
the depositing the second bow compensation layer of material on the backside of the first substrate further comprises contacting the backside of the substrates with ammonia and a silicon-containing precursor.

16. The method of claim 1, wherein the first bow compensation layer of material and the second bow compensation layer of material comprise silicon oxide.

17. The method of claim 16, wherein:
the first substrate is bowed with a first convex bow when provided to the first station, and
the second substrate is bowed with a second convex bow when provided to the second station.

18. The method of claim 16, wherein:
the depositing the first bow compensation layer of material on the backside of the first substrate and on the backside of the second substrate further comprises contacting the backside of the substrates with nitrous oxide and a silicon-containing precursor, and
the depositing the second bow compensation layer of material on the backside of the first substrate further comprises contacting the backside of the substrates with nitrous oxide and a silicon-containing precursor.

19. The method of claim 1, wherein:
when provided to the first station, the first substrate is bowed and has layers deposited on the front side of the first substrate that have internal compressive stress,
when provided to the second station, the second substrate is bowed and has layers deposited on the front side of the second substrate that have internal compressive stress, and
the first bow compensation layer of material deposited on the backside of the first substrate and on the backside of the second substrate has internal tensile stress.

20. The method of claim 1, wherein:
when provided to the first station, the first substrate is bowed and has layers deposited on the front side of the first substrate that have internal tensile stress,
when provided to the second station, the second substrate is bowed and has layers deposited on the front side of the second substrate that have internal tensile stress, and
the first bow compensation layer of material deposited on the backside of the first substrate and on the backside of the second substrate has internal compressive stress.

21. The method of claim 1, wherein the depositing the bow compensation layers of material onto the first substrate and the second substrate is performed by plasma enhanced chemical vapor deposition.

22. The method of claim 21, wherein:
the depositing the bow compensation layers of material onto the first substrate and the second substrate comprises igniting a plasma at the first station, and the plasma at the first station is not extinguished during and between the concurrently depositing and the depositing the second layer of material on the backside of the first substrate.

23. The method of claim 1, further comprising:
determining, before the providing the first substrate to the first station, measured first bow of the first substrate,
determining, before the providing the second substrate to the second station, a measured second bow of the second substrate,
determining, based on the measured first bow, a first deposition time for depositing the bozo compensation material onto the first substrate,
determining, based on the measured second bow, a second deposition time depositing the bow compensation material onto the second substrate, wherein:
the first deposition time is greater than the second deposition time,
the concurrently depositing the first bow compensation layer of material on the backside of the first substrate and on the backside of the second substrate is performed for the second deposition time,
the depositing the second bow compensation layer of material on the backside of the first substrate is performed for a third deposition time, and
the first deposition time substantially equals the second deposition time plus the third deposition time.

24. The method of claim 23, wherein the determining the measured first bow and the measured second bow are determined using one or more lasers.

25. The method of claim 23, wherein the determining the first deposition time further comprises applying the measured first how, or a parameter derived therefrom, to a relationship between (i) a backside deposition time required to reduce a bow on a substrate, and (ii) a variable representing a bow reduction amount, wherein the applying returns the first deposition time.

26. The method of claim 25, wherein the relationship is substantially linear.

27. The method of claim 1, wherein:
the depositing the first bow compensation layer of material and the depositing the second bow compensation layer of material on the backside of the first substrate are performed for a time range between 60 seconds and 2,000 seconds, and
the depositing the first bow compensation layer of material on the backside of the second substrate is performed for a time range between 60 seconds and 2,000 seconds.

28. The method of claim 1, wherein:
the depositing the first bow compensation layer of material and the second bow compensation layer of material on the backside of the first substrate results in a first total thickness of material on the backside of the first substrate, and
the depositing the first bow compensation layer of material on the backside of the second substrate results in a second total thickness of material on the backside of the second substrate that is smaller than the first total thickness.

* * * * *